(12) United States Patent
Tokumoto et al.

(10) Patent No.: US 8,300,130 B2
(45) Date of Patent: Oct. 30, 2012

(54) METHOD OF DRIVING SOLID-STATE IMAGING DEVICE

(75) Inventors: Junji Tokumoto, Osaka (JP); Toshifumi Habara, Osaka (JP); Takeshi Fujita, Kyoto (JP); Kazuya Yonemoto, Osaka (JP)

(73) Assignee: Panasonic Corporation, Osaka (JP)

( * ) Notice: Subject to any disclaimer, the term of this patent is extended or adjusted under 35 U.S.C. 154(b) by 290 days.

(21) Appl. No.: 12/808,264

(22) PCT Filed: Dec. 17, 2008

(86) PCT No.: PCT/JP2008/003804
§ 371 (c)(1),
(2), (4) Date: Jun. 15, 2010

(87) PCT Pub. No.: WO2009/078173
PCT Pub. Date: Jun. 25, 2009

(65) Prior Publication Data
US 2010/0271528 A1    Oct. 28, 2010

(30) Foreign Application Priority Data
Dec. 17, 2007    (JP) ................. 2007-324997

(51) Int. Cl.
*H04N 5/335* (2011.01)
(52) U.S. Cl. ...................... 348/311; 348/315
(58) Field of Classification Search ............... 348/311, 348/312, 308; 257/292, 293
See application file for complete search history.

(56) References Cited

U.S. PATENT DOCUMENTS

| 6,606,124 | B1* | 8/2003 | Hatano et al. ............... 348/311 |
| 6,784,469 | B1* | 8/2004 | Yamane et al. ............... 257/222 |
| 6,825,879 | B1 | 11/2004 | Furumiya |
| 7,038,723 | B1 | 5/2006 | Kuroda et al. |
| 2003/0107662 | A1 | 6/2003 | Suzuki |
| 2005/0088557 | A1 | 4/2005 | Kuroda et al. |
| 2006/0119725 | A1 | 6/2006 | Kuroda et al. |
| 2006/0268141 | A1 | 11/2006 | Kobayashi et al. |
| 2009/0317936 | A1* | 12/2009 | Kanbe ............... 438/75 |
| 2010/0171855 | A1 | 7/2010 | Habara et al. |

FOREIGN PATENT DOCUMENTS

| JP | 7-322143 | 12/1995 |
| JP | 2001-16510 | 1/2001 |
| JP | 2003-179813 | 6/2003 |
| JP | 2006-324907 | 11/2006 |

* cited by examiner

*Primary Examiner* — Tuan Ho
(74) *Attorney, Agent, or Firm* — McDermott Will & Emery LLP

(57) ABSTRACT

The present invention has an object of providing a method of driving a solid-state imaging device which can reduce reading voltage even when transfer electrodes adjacent to reading electrodes are smaller than the reading electrodes as a result of miniaturization of pixels. The solid-state imaging device includes photodiodes and vertical CCDs each including transfer electrodes. The method includes: reading signal charges from the photodiodes by setting the electric potential of a predetermined transfer electrode among the reading electrodes to the electric potential $V_H$; transferring the read signal charges in a column direction by applying driving pulses having electric potentials $V_M$ and $V_L$ to the transfer electrodes. Each of the reading electrodes has a larger area than the adjacent transfer electrodes. In reading the signal charges, while the electric potential $V_H$ is being applied, the electric potential of one of the transfer electrodes adjacent to the predetermined reading electrode is set to the electric potential $V_M$, and the electric potentials of the other one of the transfer electrodes adjacent to the predetermined reading electrode and a reading electrode other than the predetermined electrode are changed.

16 Claims, 39 Drawing Sheets

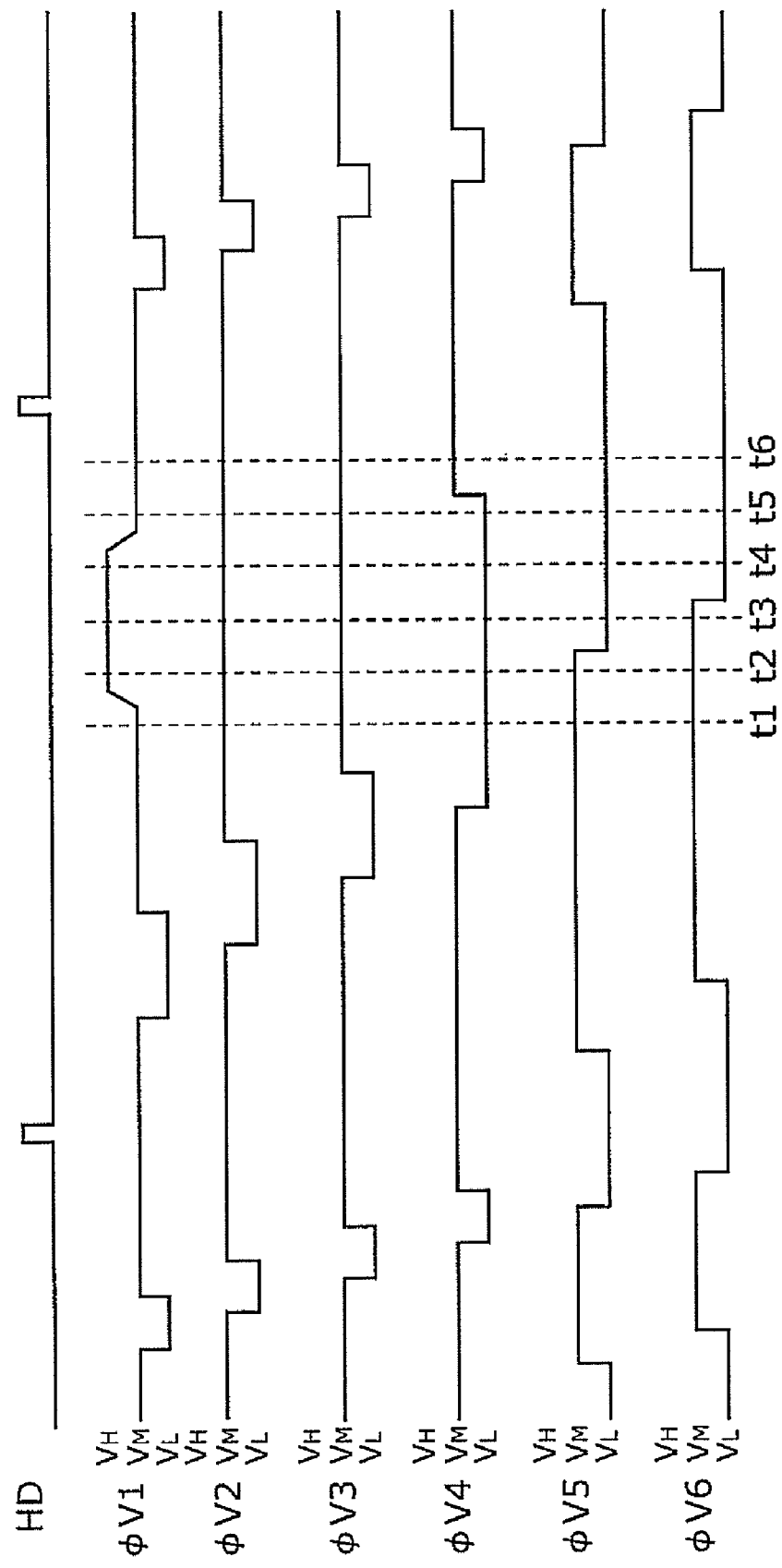

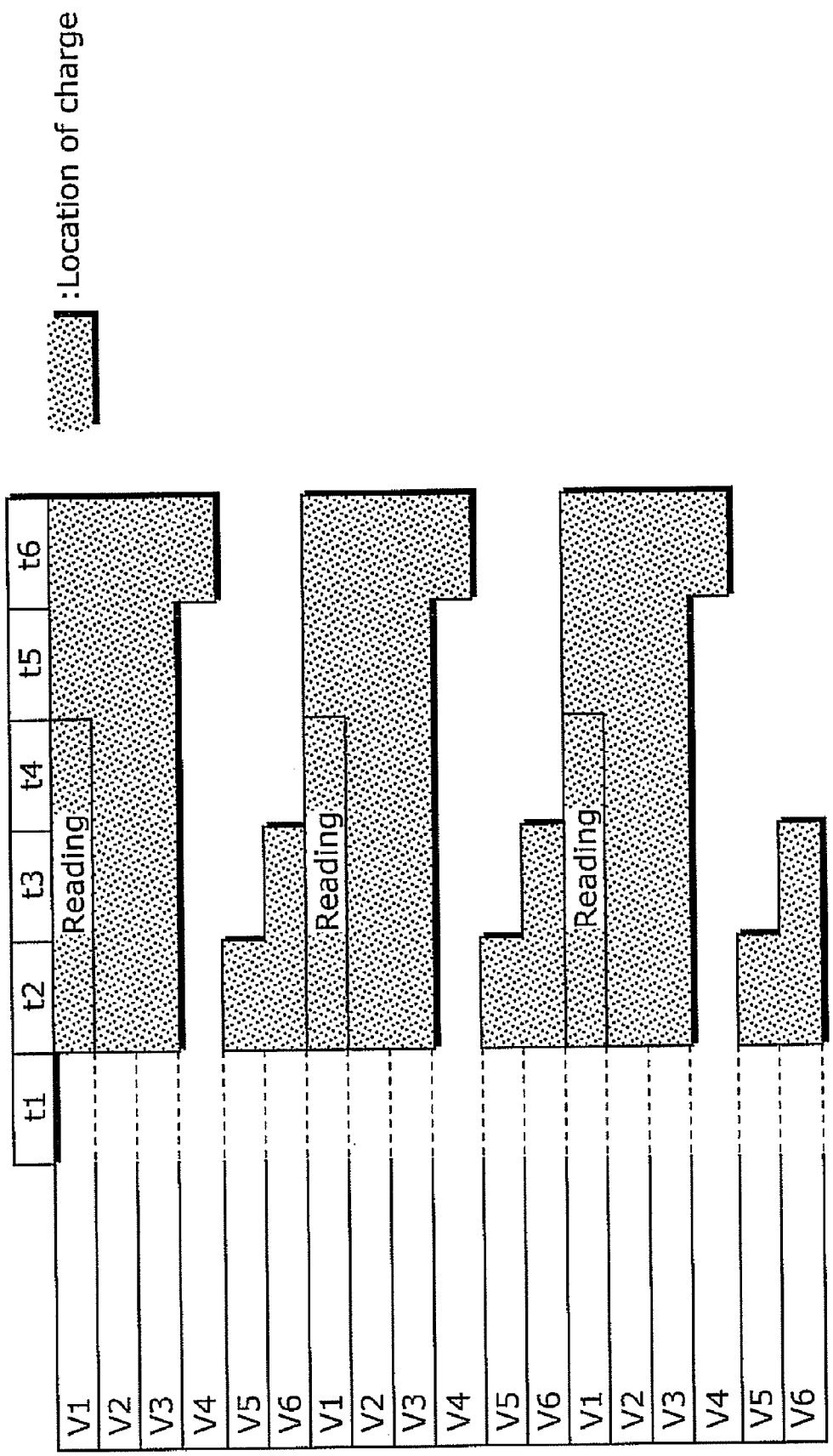

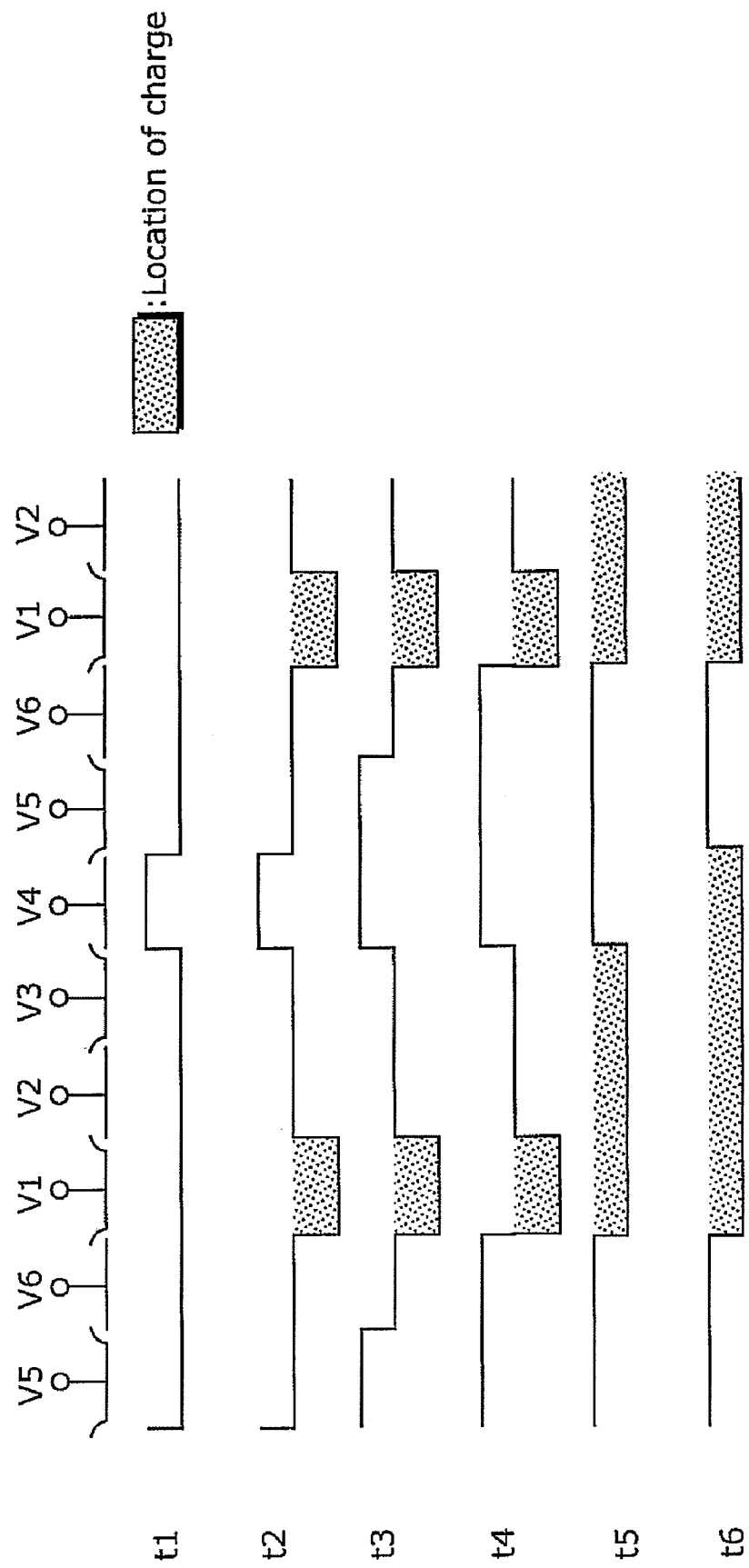

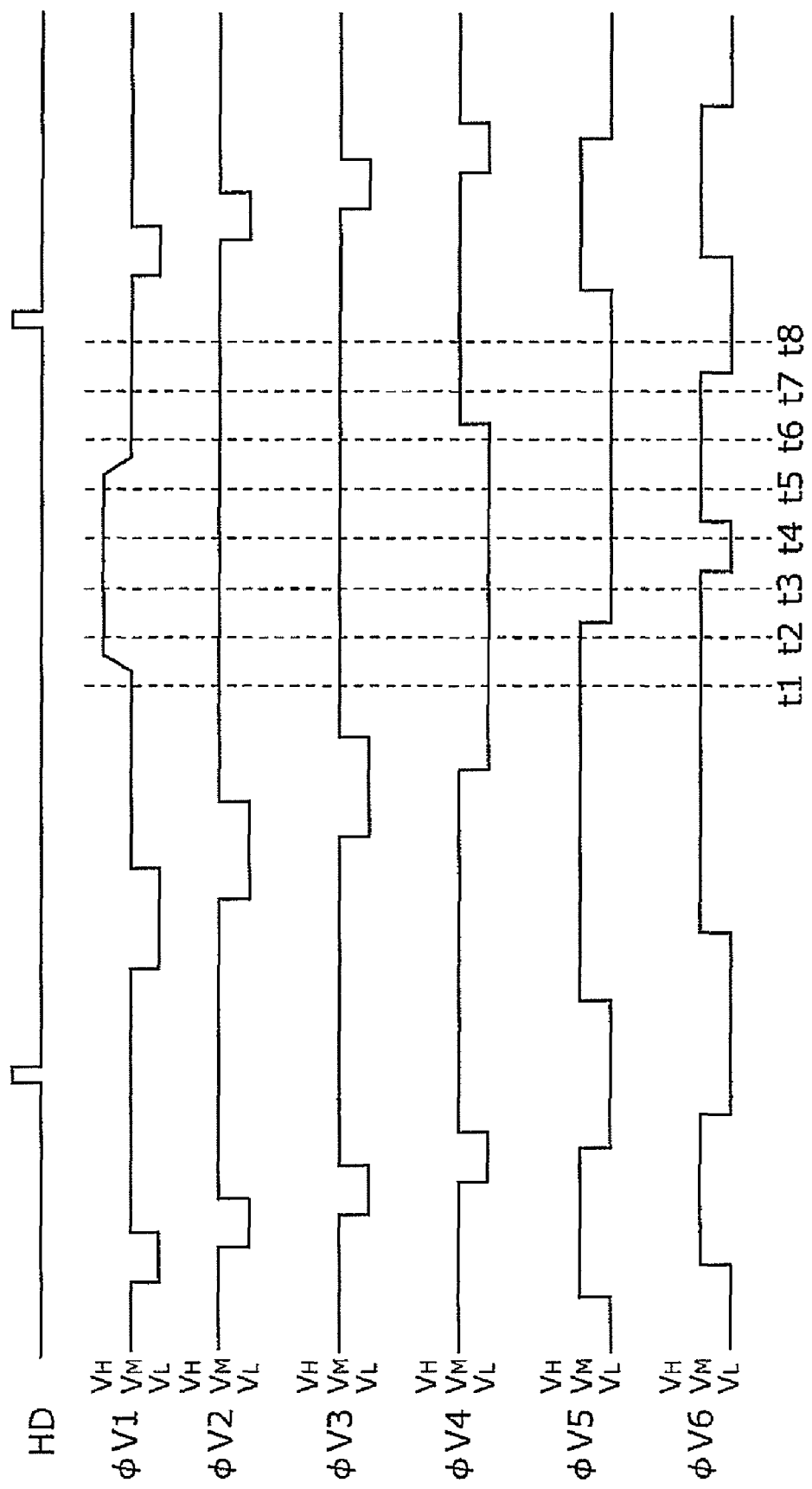

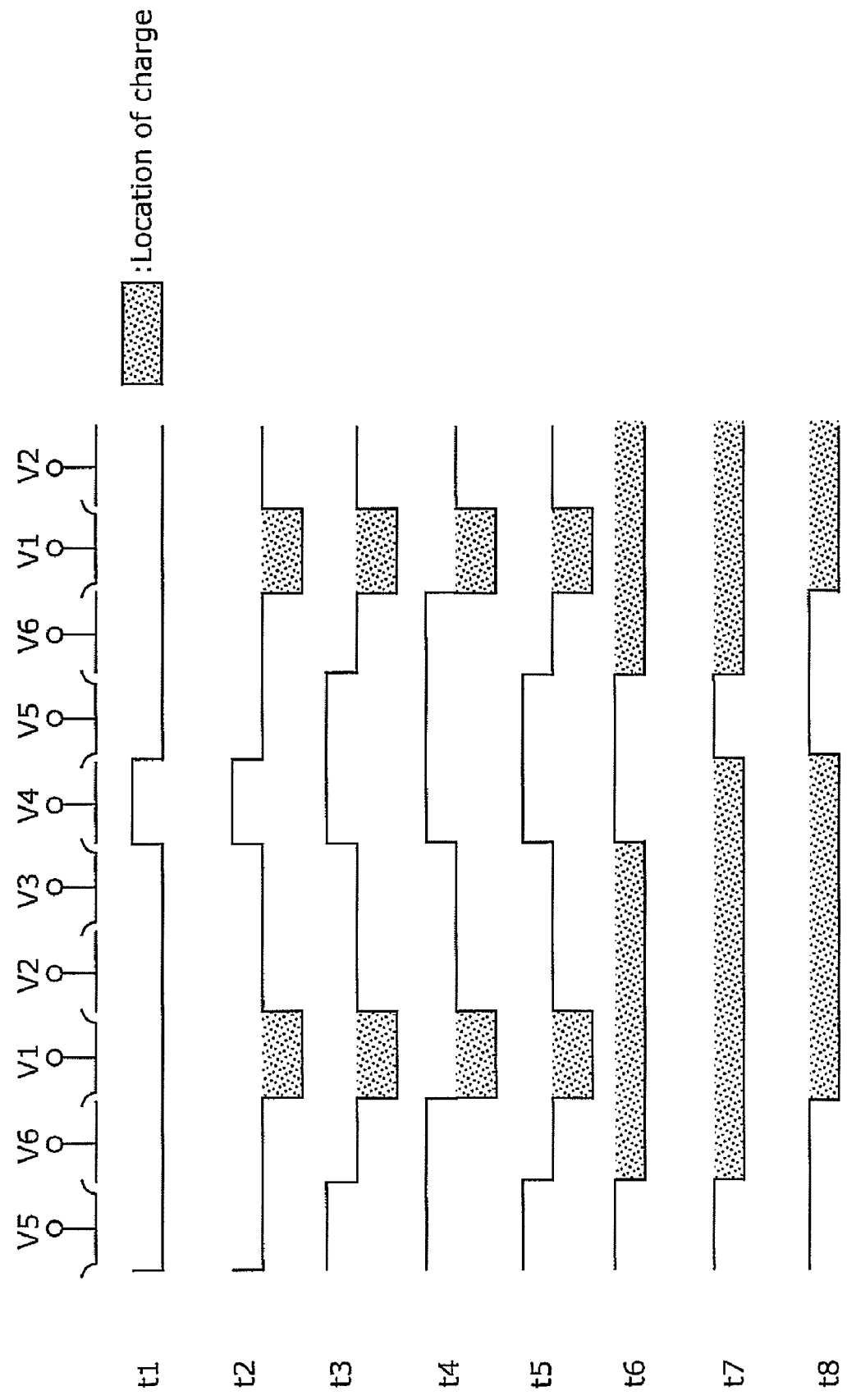

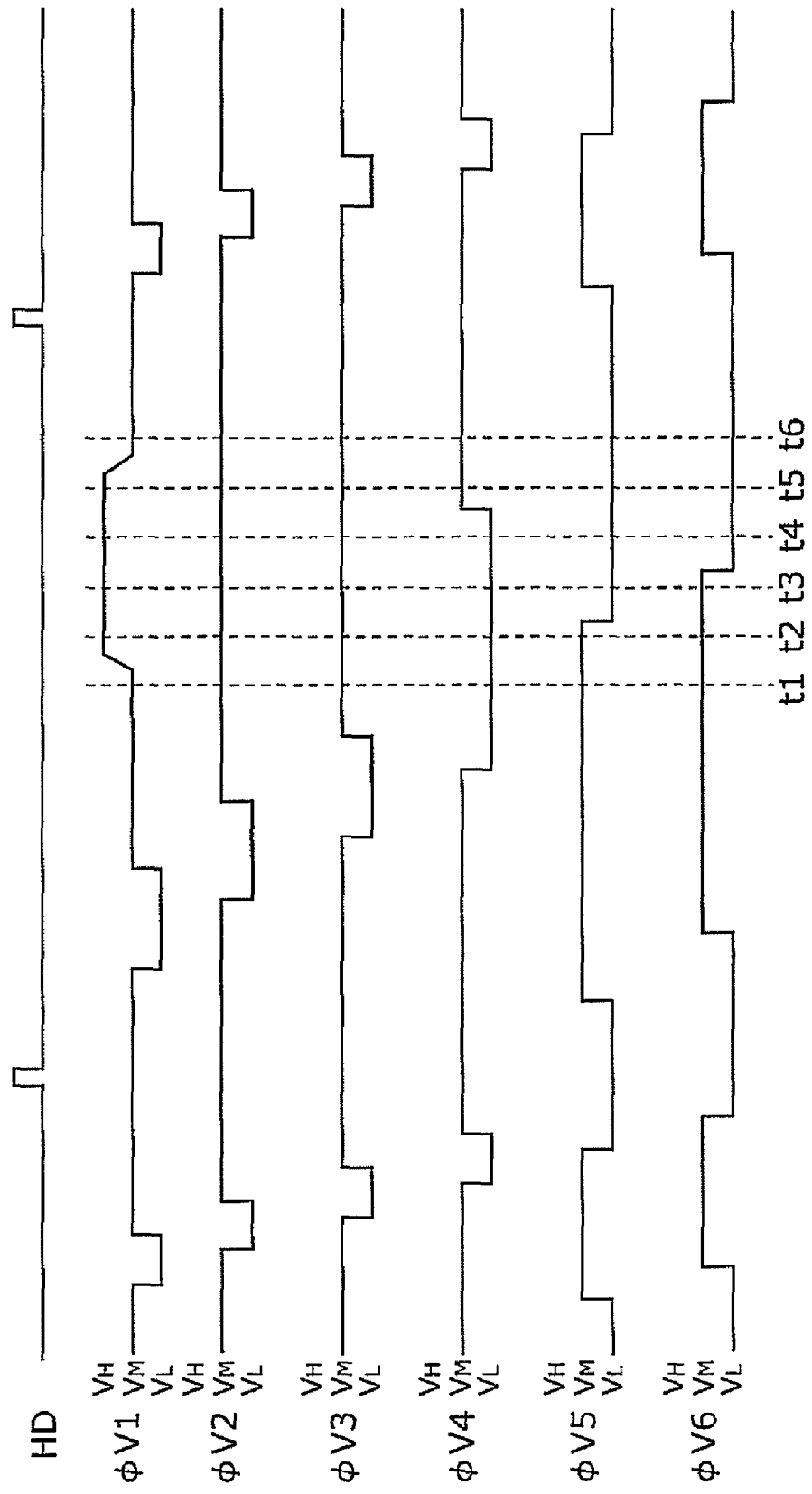

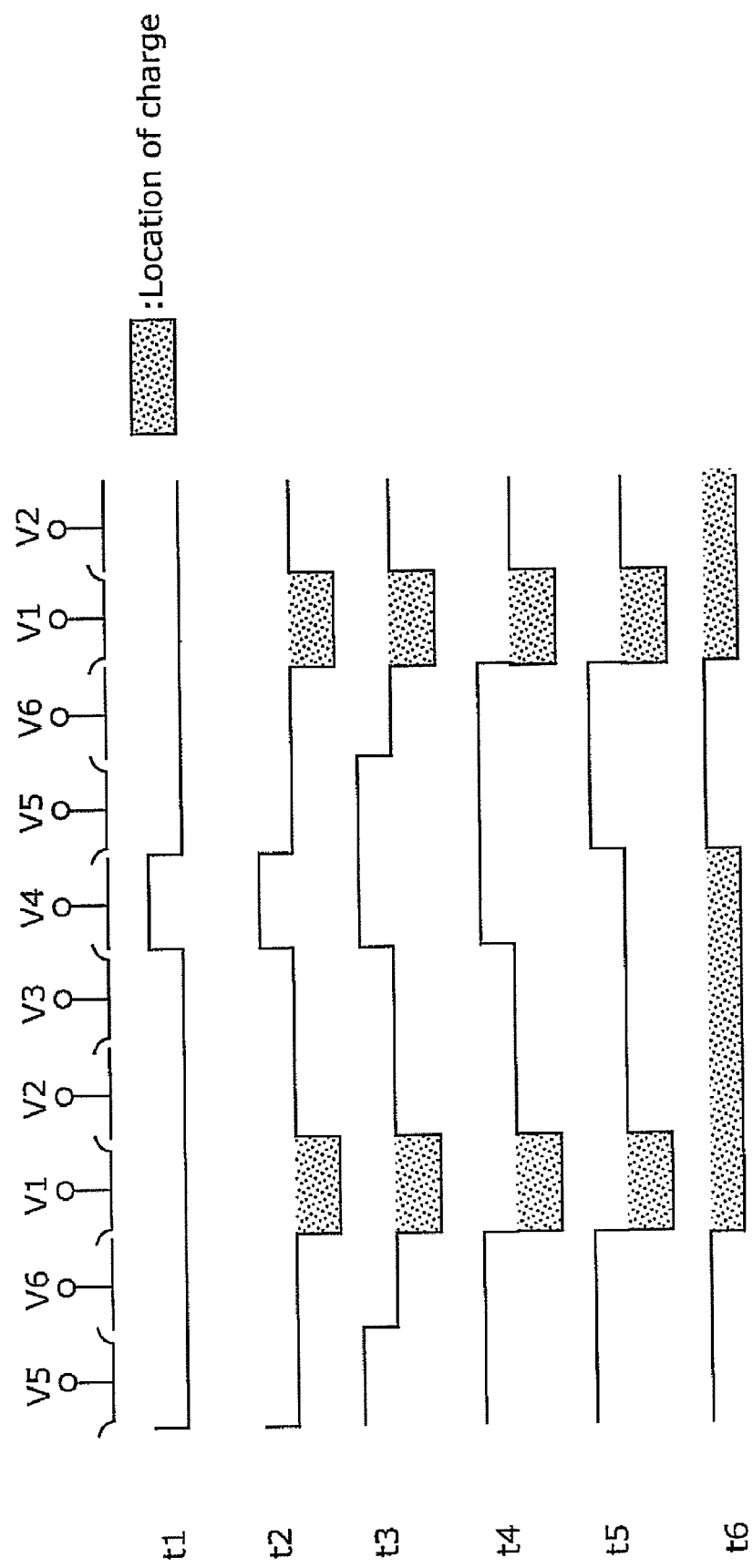

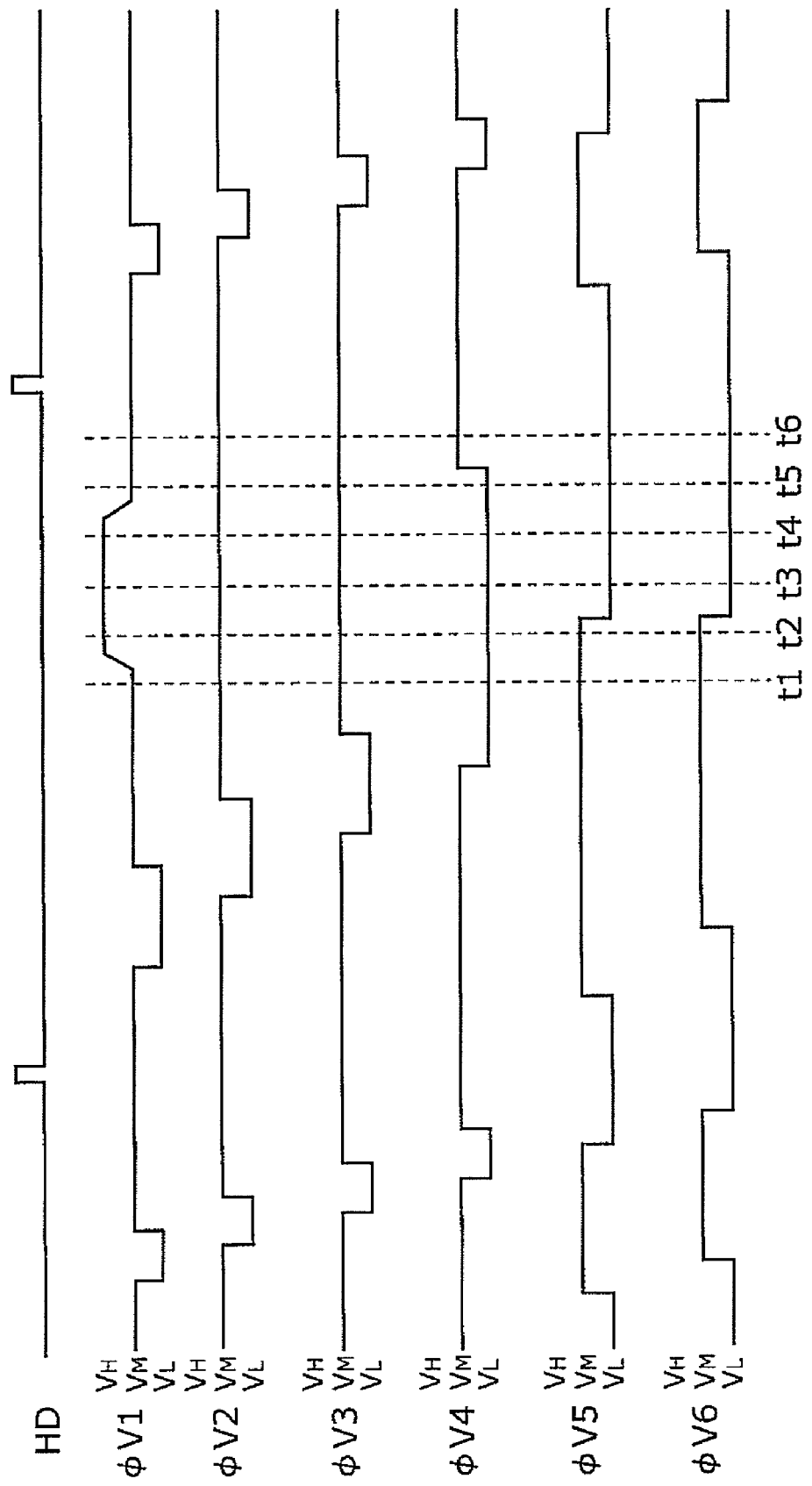

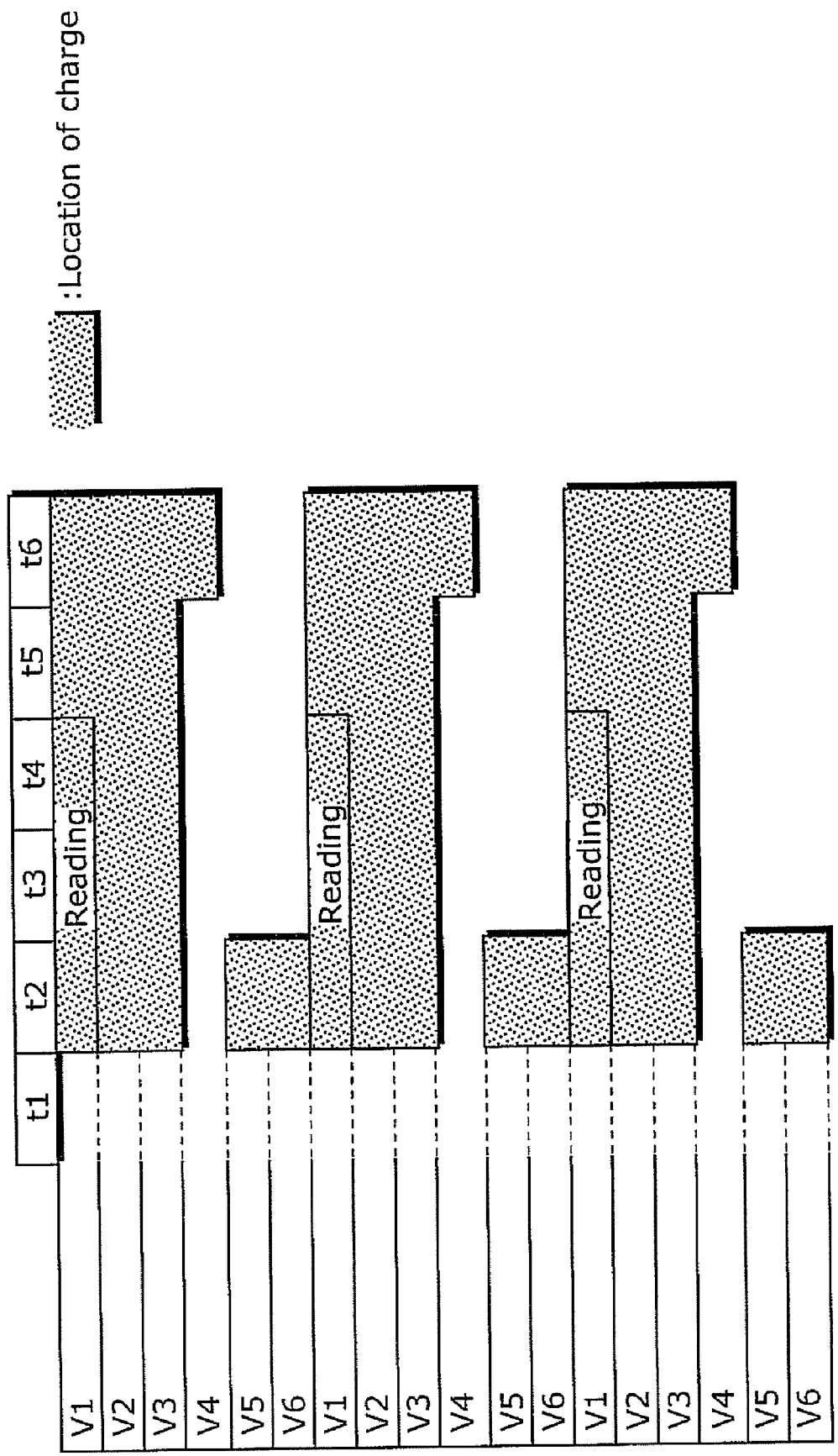

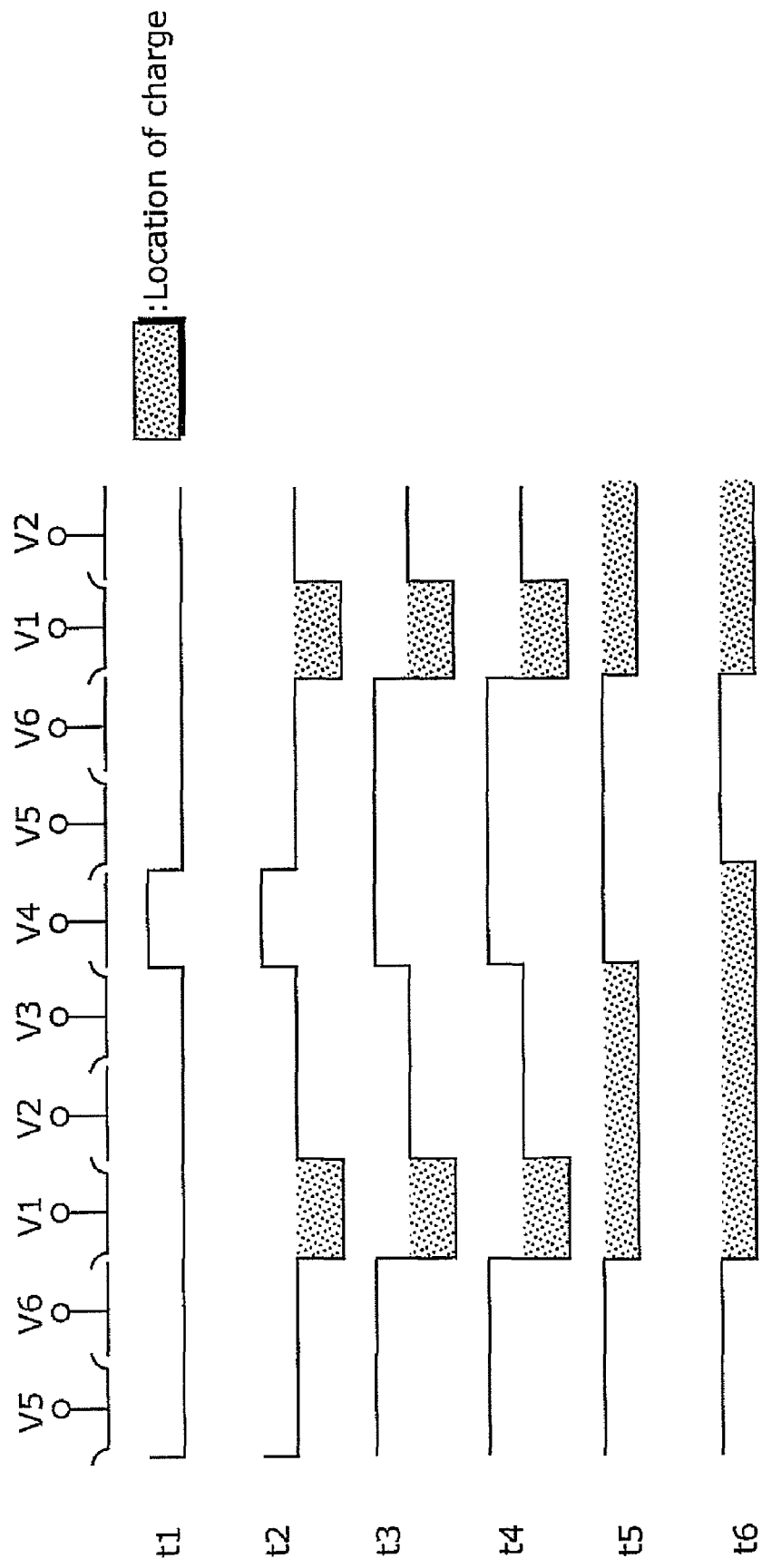

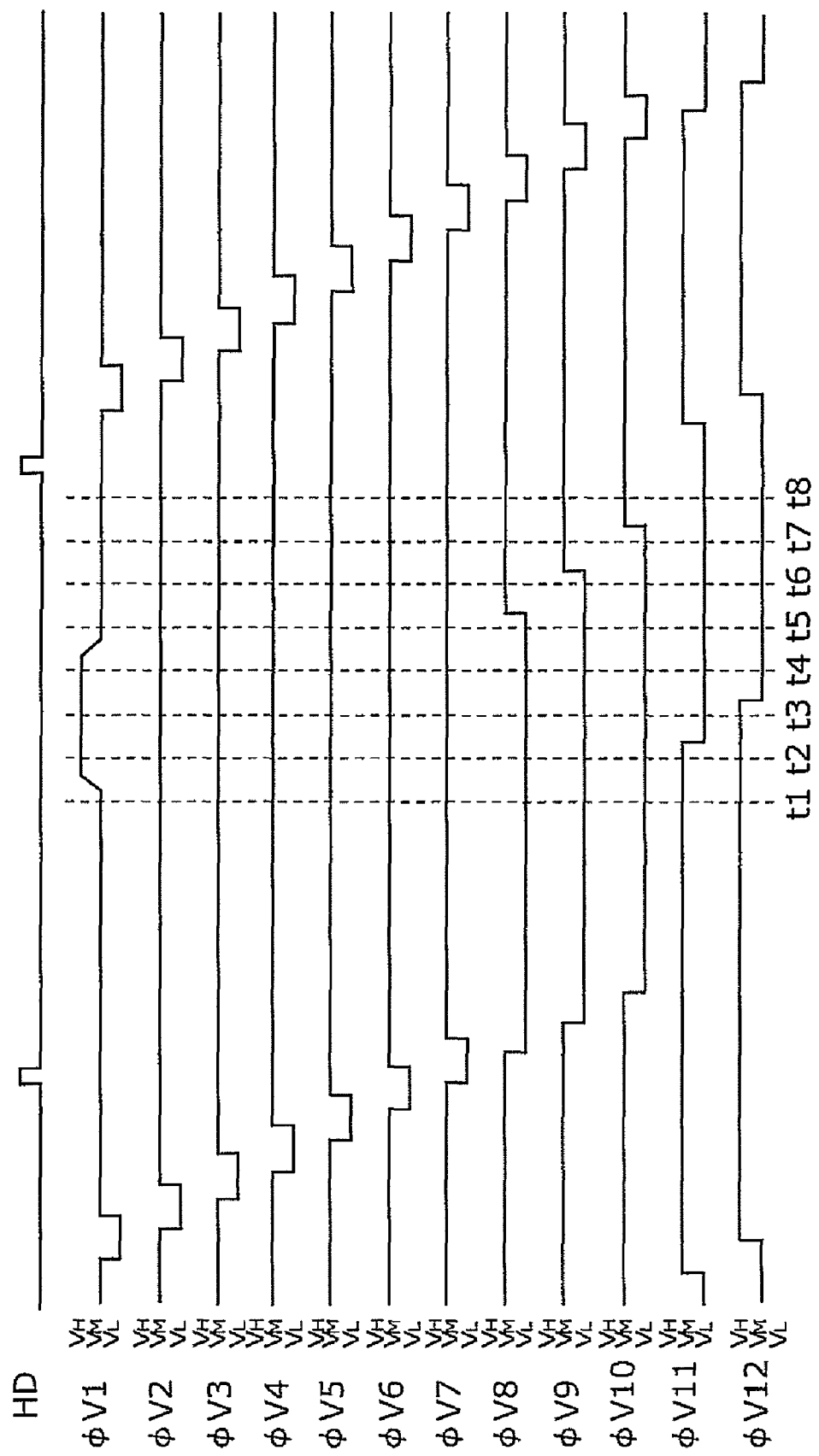

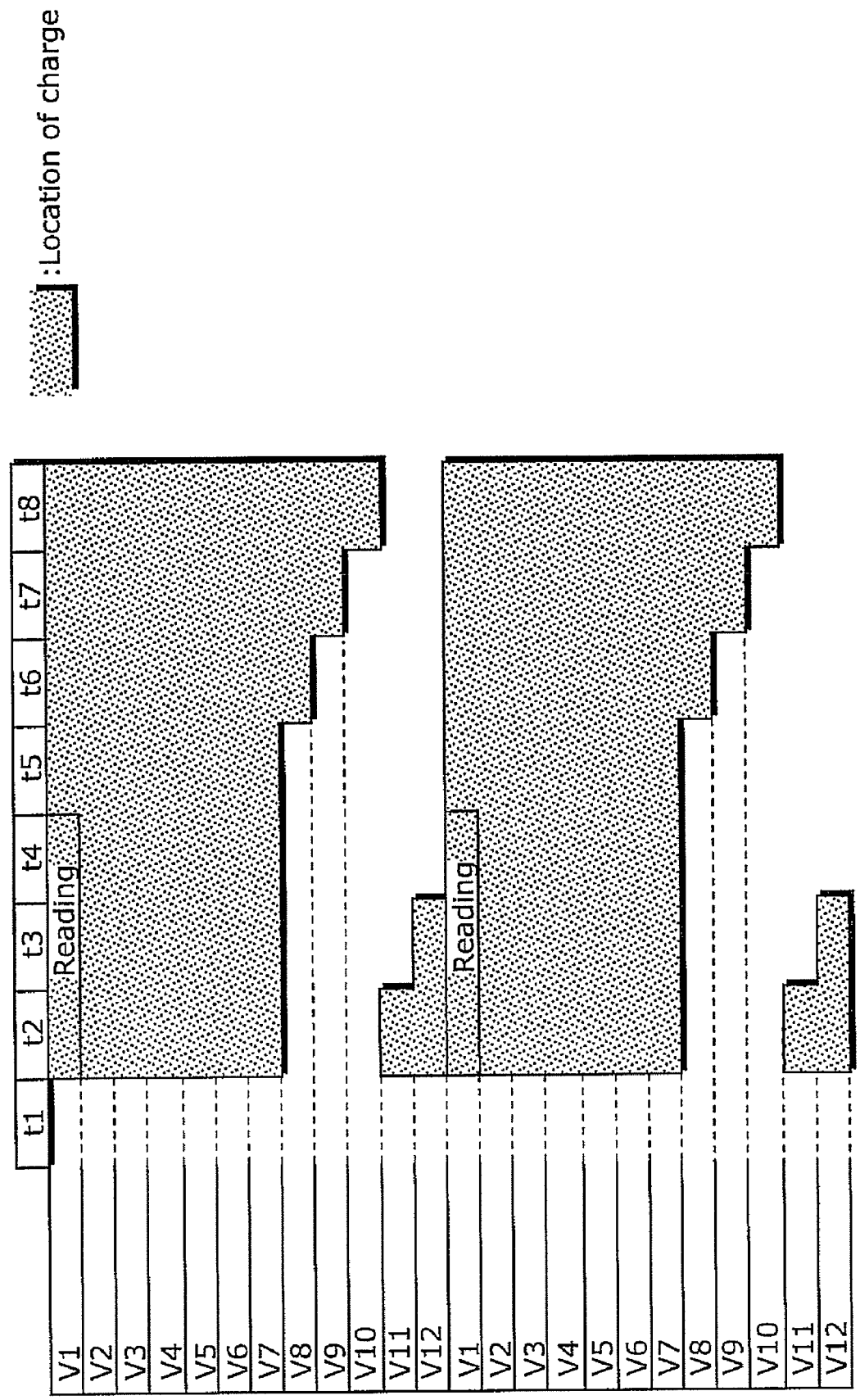

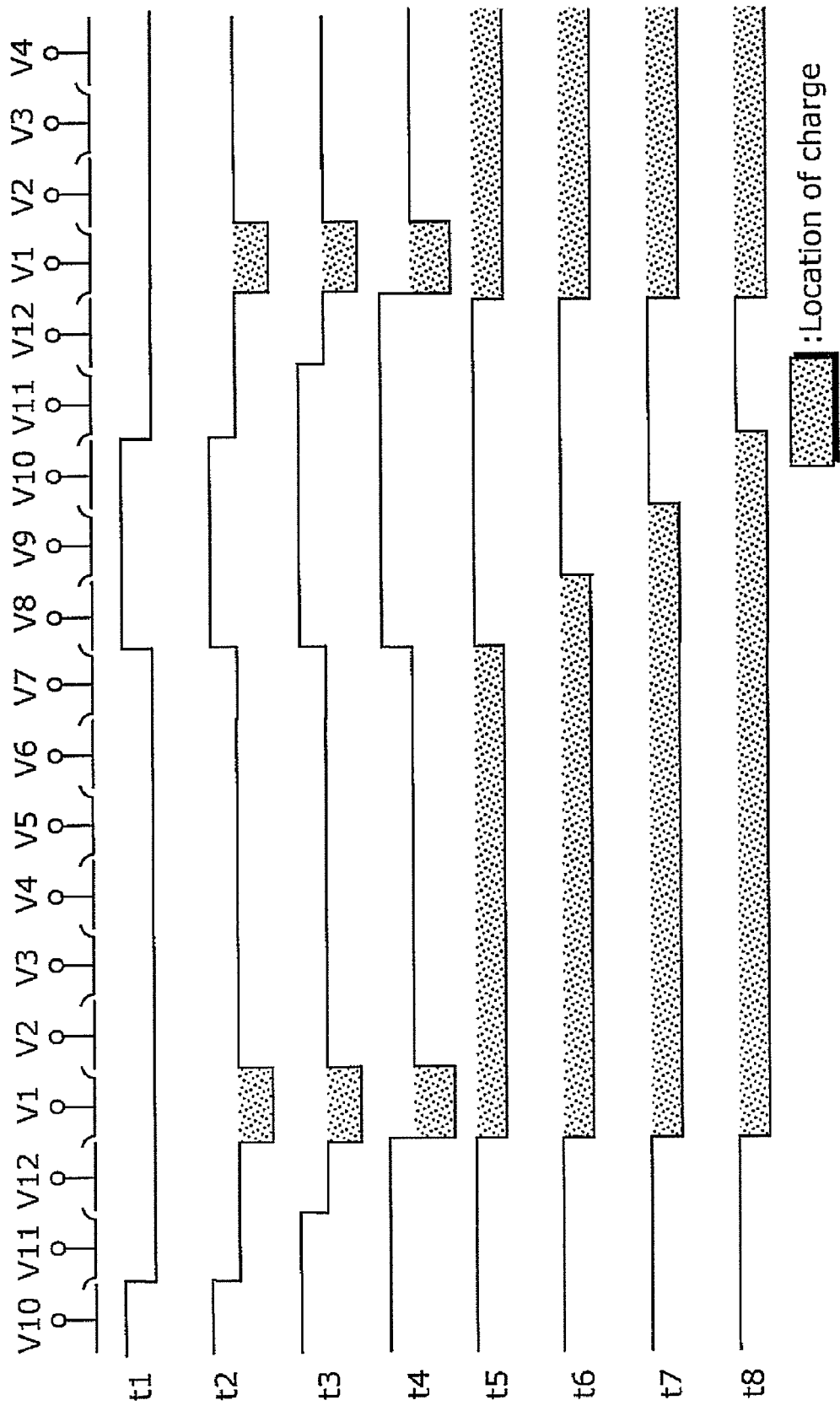

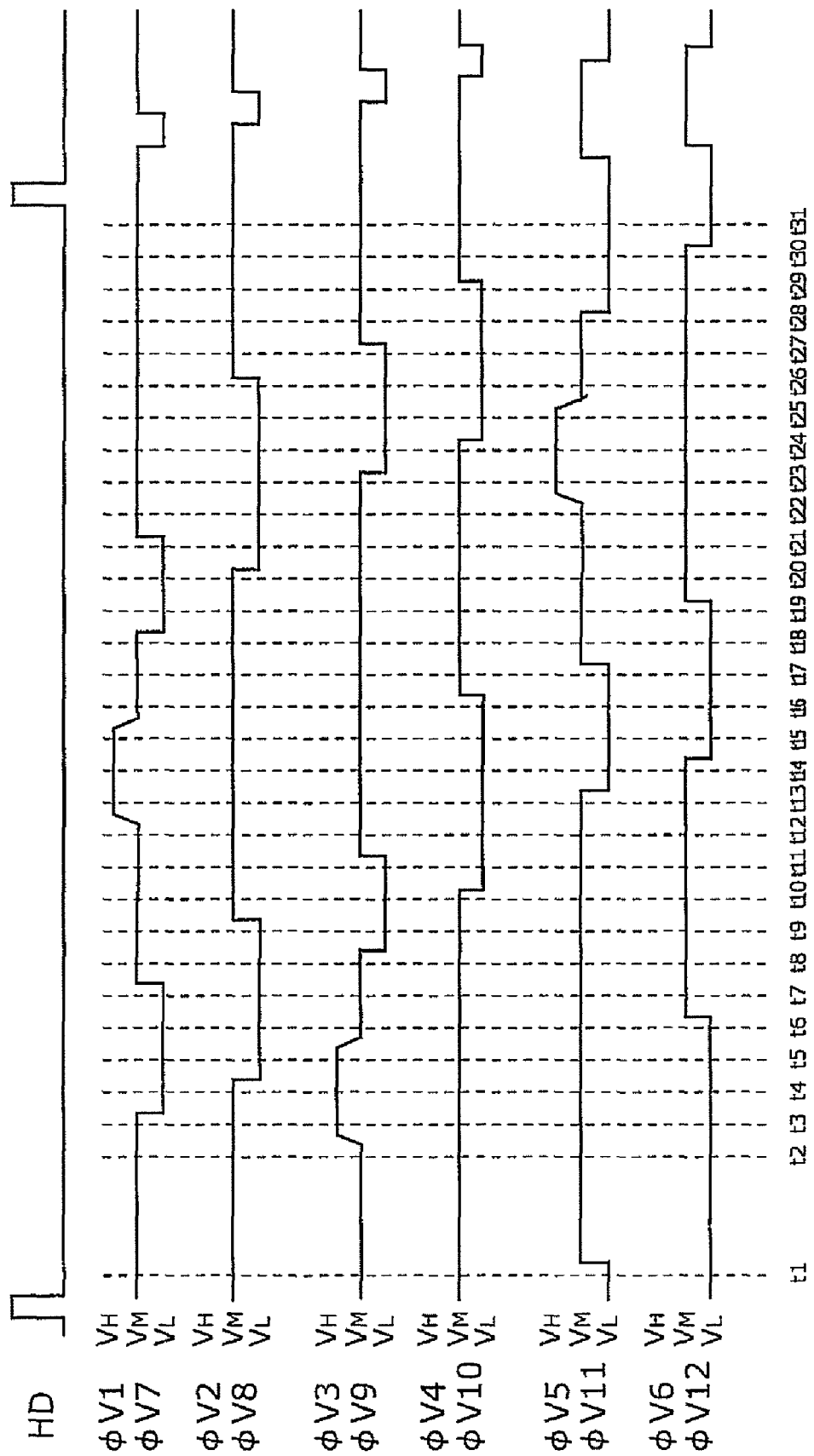

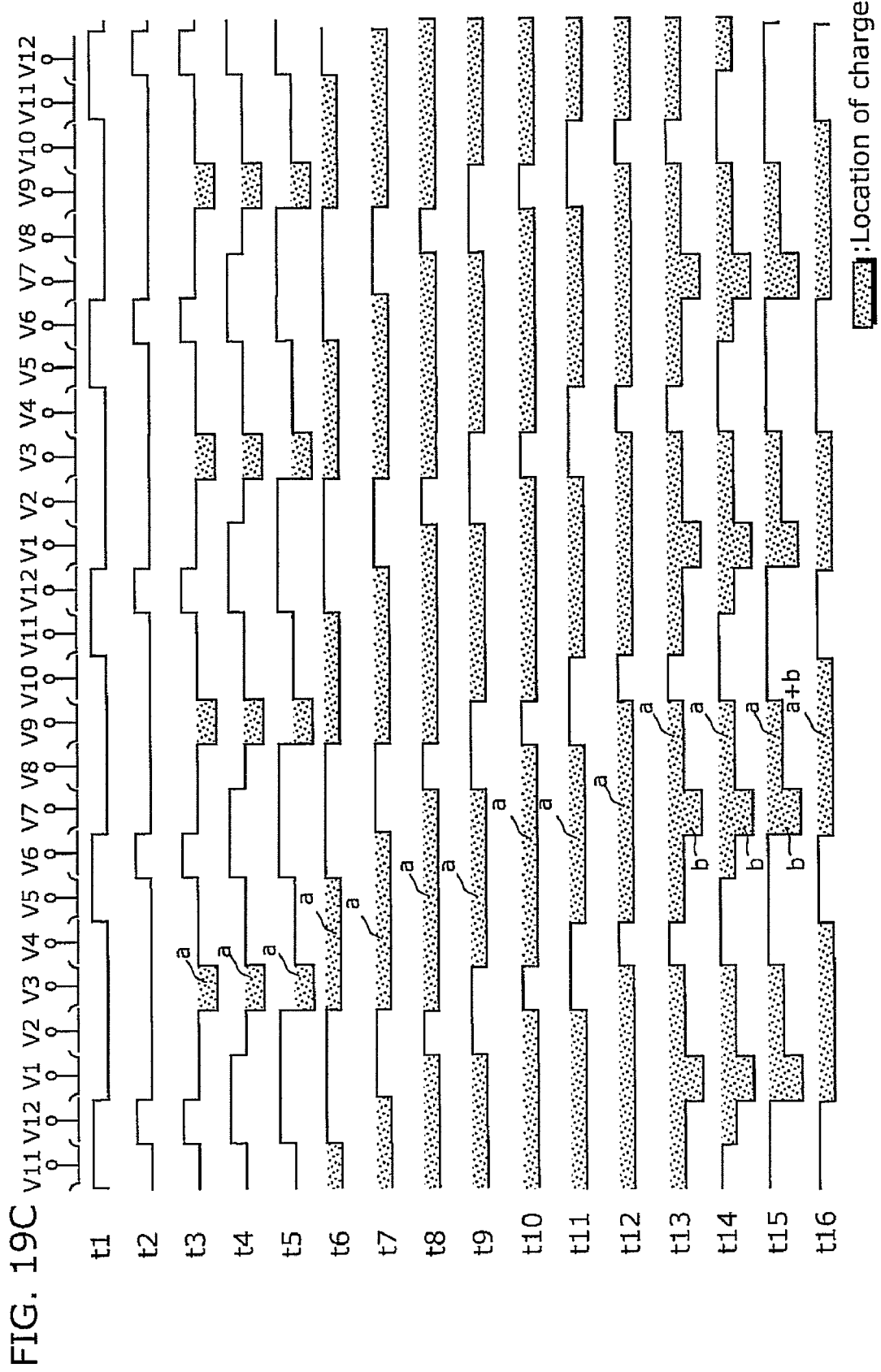

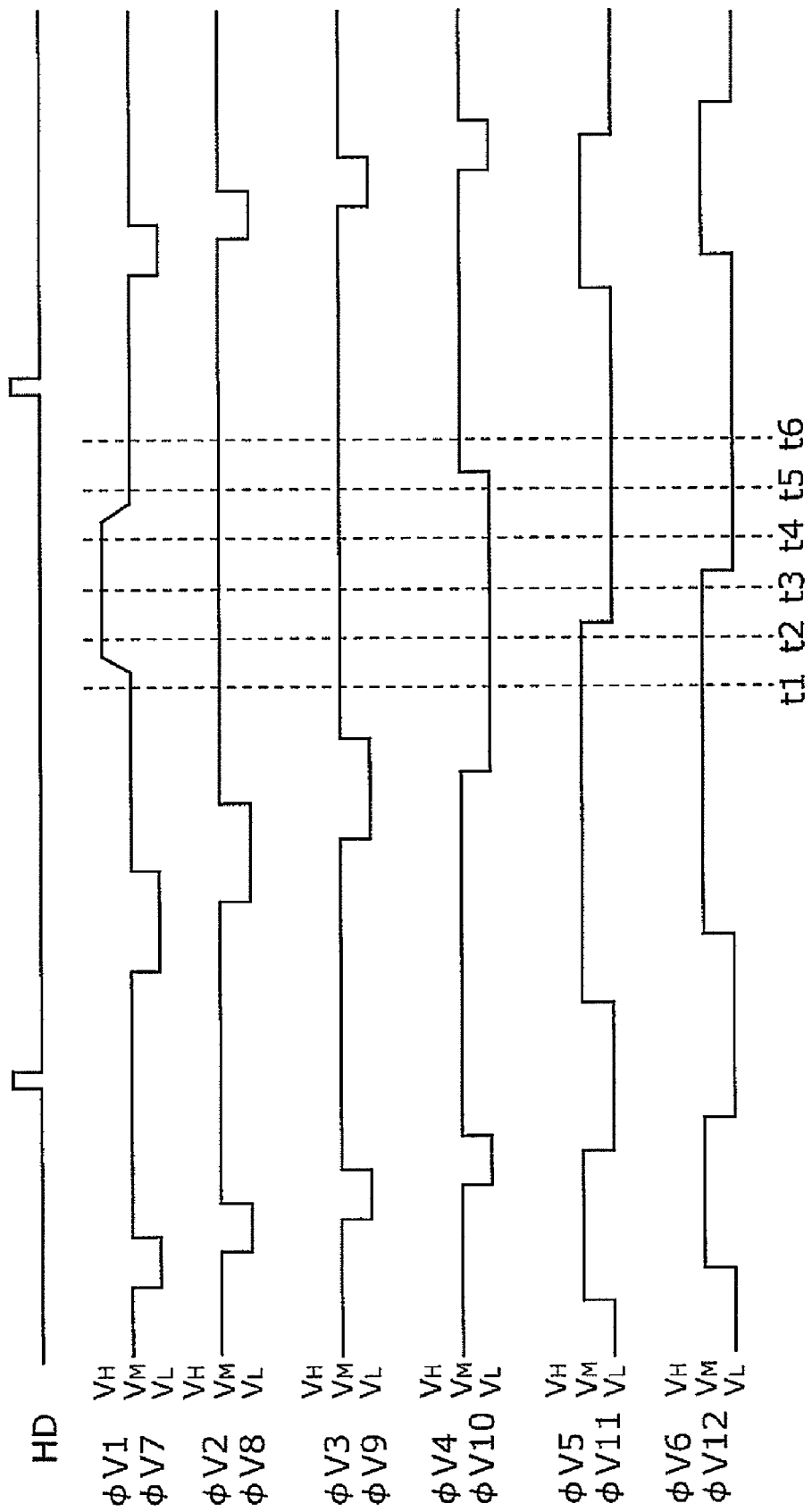

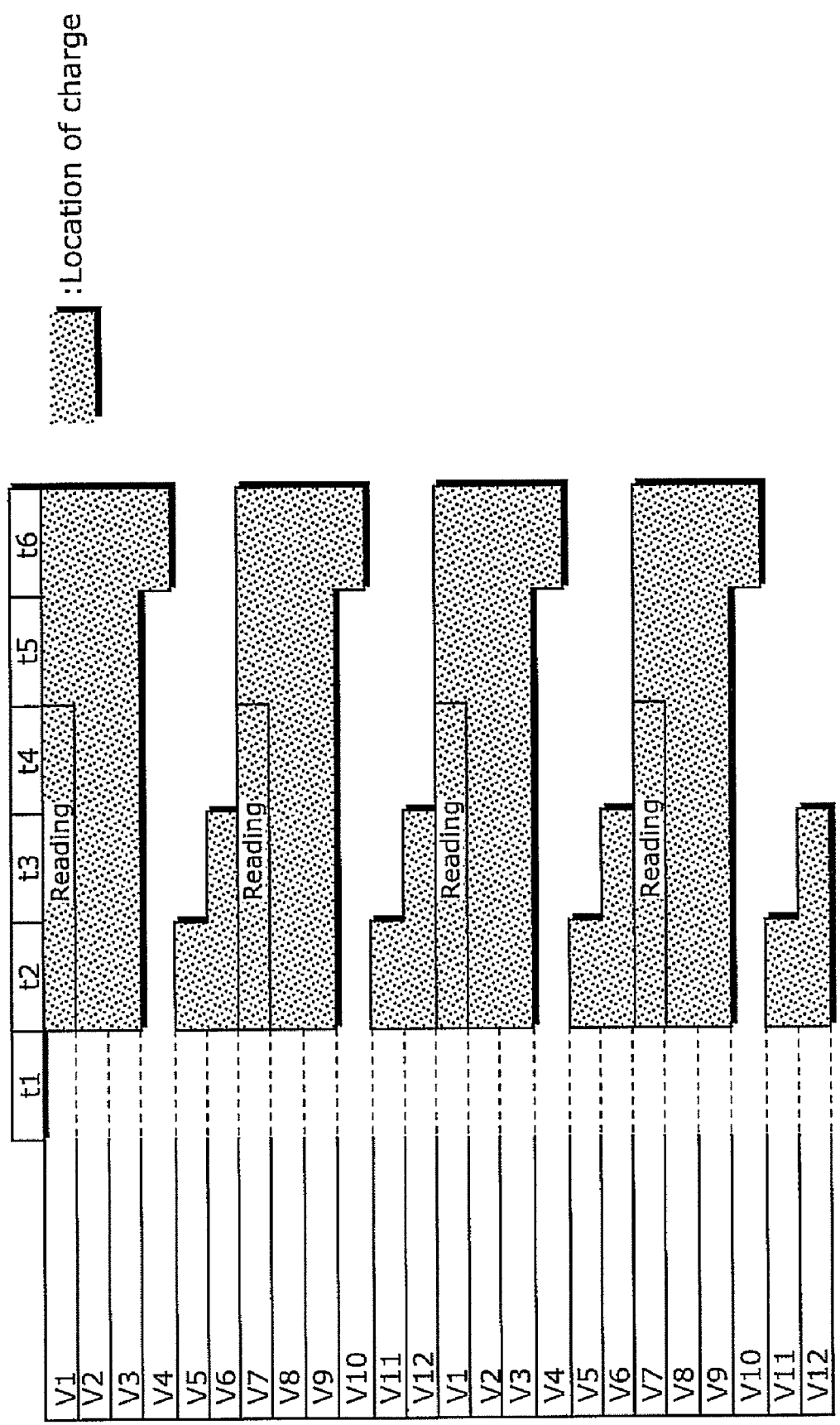

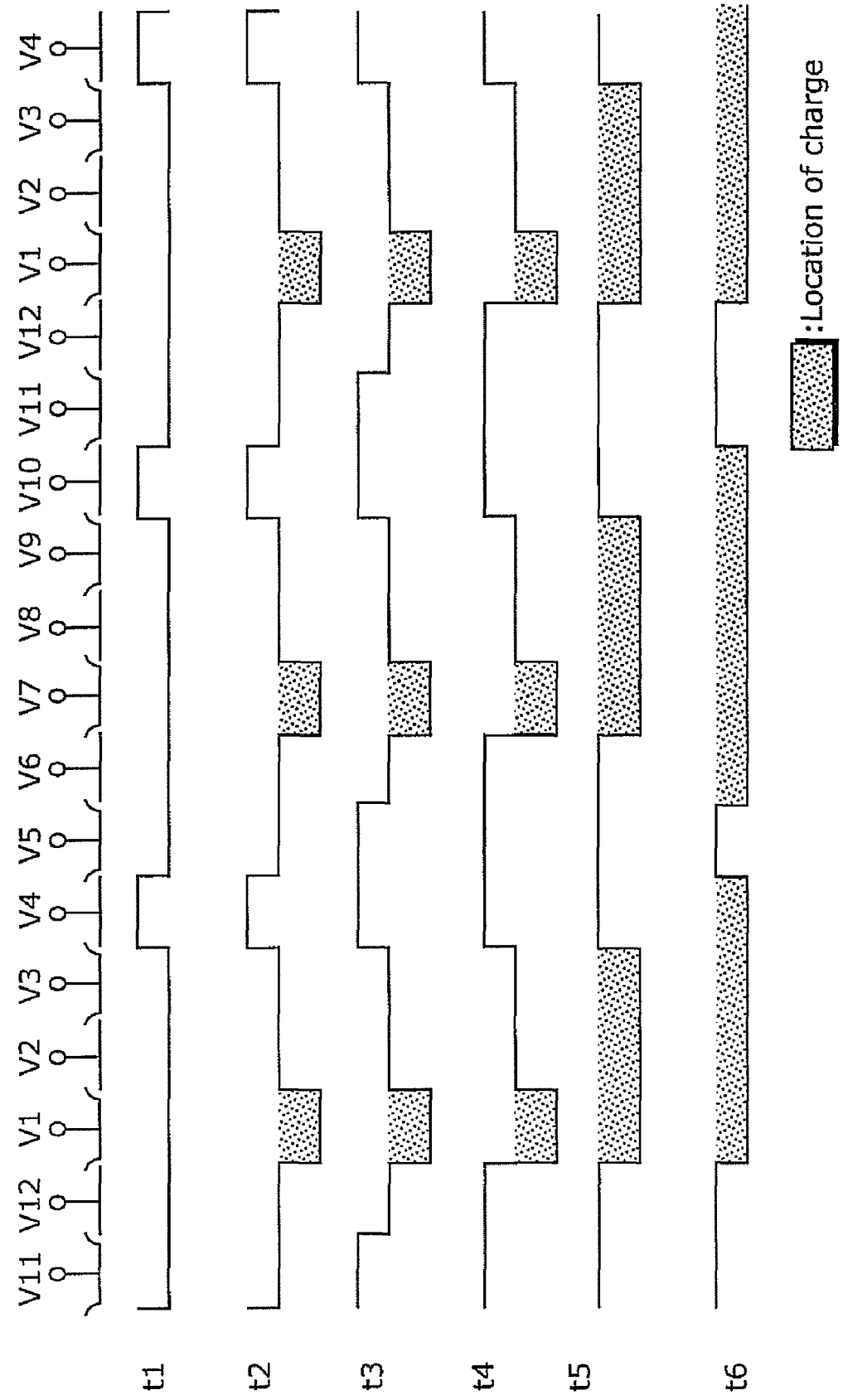

FIG. 21
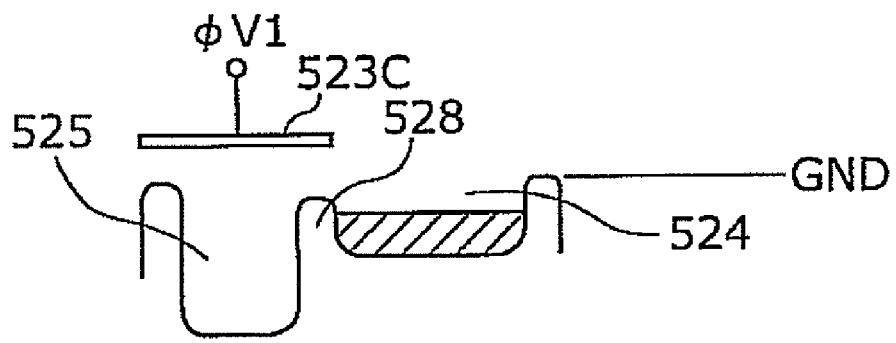
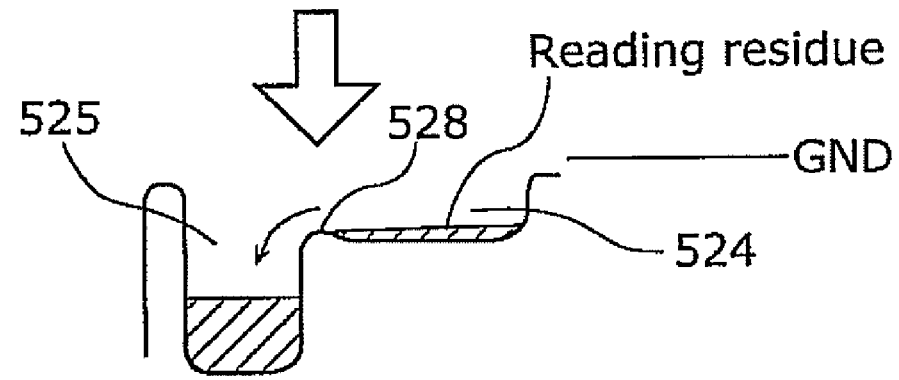
FIG. 22
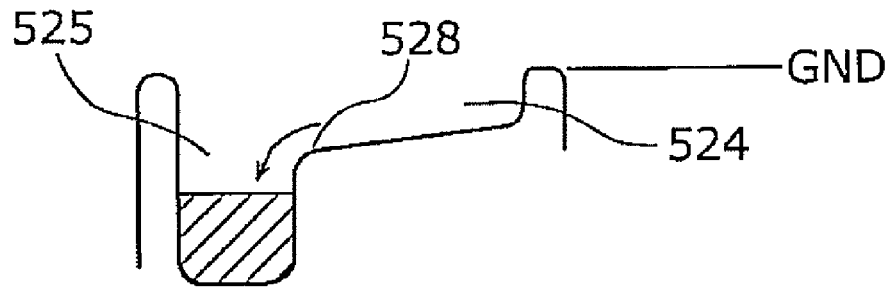

METHOD OF DRIVING SOLID-STATE IMAGING DEVICE

TECHNICAL FIELD

The present invention relates to a method of driving a solid-state imaging device, and in particular to a method of transferring a signal charge in a vertical CCD.

BACKGROUND ART

Generally, a CCD (Charge Coupled Device) solid-state imaging device has been used for a solid-state imaging device included in an imaging apparatus such as a video camera and a digital still camera. In the CCD solid-state imaging device, signal charges generated using incident light in photodiodes are read to a vertical CCD, and the read signal charges are transferred to a charge detecting unit (FD unit) by the vertical CCD and a horizontal CCD.

When it is attempted that power consumption is reduced in such a CCD solid-state imaging device by lowering reading voltages from the photodiodes to the vertical CCD, a problem as shown in FIG. 21 occurs. To put it differently, when a reading voltage $\phi V1$ to be applied to a transfer electrode (reading electrode) 523C is lower, a variation in electric potential (GND≧variation in positive direction) of a channel stop 528 is significantly influenced and a portion of a signal charge accumulated in a photodiode 524 is not read into a vertical CCD 525, which causes a reading residue of the signal charge. Patent Reference 1 discloses a method of driving a solid-state imaging device as a technique for solving such a problem.

In the method, when the reading voltage $\phi V1$ is applied to the transfer electrode 523C, a reverse-modulated pulse that is transited to a reverse polarity with respect to the reading voltage $\phi V1$ is applied to a transfer electrode adjacent to the transfer electrode 523C. With this, since the influence on the variation in electric potential of the channel stop 528 below the transfer electrode 523C can be suppressed as shown in FIG. 22, the reading residue of the signal charge of the photodiode 524 can be prevented from occurring.

Patent Reference 1: Japanese Unexamined Patent Application Publication No. 7-322143

DISCLOSURE OF INVENTION

Problems that Invention is to Solve

Along with miniaturization of pixels in recent years, in order to ensure a reading channel width necessary for reading a signal charge, the area of the transfer electrode adjacent to the reading electrode 523C to which the reading voltage is applied is smaller than that of the reading electrode 523C. Thus, even when the reverse-modulated pulse that is transited to a reverse polarity with respect to the reading voltage $\phi V1$ is applied to the transfer electrode that is adjacent to the reading electrode 523C when applying the reading voltage $\phi V1$, it is difficult to sufficiently suppress the influence on the variation in electric potential of the channel stop 528 below the reading electrode 523C. Especially, when the pixel cell size is miniaturized to 2.4 μm or less, this problem becomes more noticeable.

In view of the above problem, the present invention has an object of providing a method of driving a solid-state imaging device which can reduce reading voltage even when the transfer electrode adjacent to the reading electrode is smaller than the reading electrode as a result of miniaturization of the pixels.

Means to Solve the Problems

In order to achieve the above object, a method of driving a solid-state imaging device according to an aspect of the present invention is a method of driving a solid-state imaging device which includes photodiodes and vertical transfer units, the photodiodes being arranged in columns and rows, and each of the vertical transfer units being provided for a corresponding one of the columns of the photodiodes and including transfer electrodes. The method includes: reading a signal charge from each of the photodiodes by setting, to a first electric potential, an electric potential of a predetermined reading electrode among reading electrodes that are included in the transfer electrodes, each of the reading electrodes being provided for reading the signal charge from a corresponding one of the photodiodes and for transferring the read signal charge in a column direction; and transferring, in the column direction, the read signal charge by applying, to each of the transfer electrodes, a driving pulse having a second electric potential and a third electric potential, the second electric potential being lower than the first electric potential, and the third electric potential being lower than the second electric potential, in which each of the reading electrodes has a larger area than two of the transfer electrodes that are adjacent to the each of the reading electrodes, and in the reading, while the first electric potential is being applied to the predetermined reading electrode, (i) an electric potential of one of the transfer electrodes that is adjacent to the predetermined reading electrode is set to the second electric potential, and (ii) an electric potential of the other one of the transfer electrodes that is adjacent to the predetermined transfer electrode and an electric potential of a reading electrode that is included in the reading electrodes and that is other than the predetermined reading electrode are changed. Here, in the reading, it may be that while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are changed to an electric potential having a reverse polarity with respect to the first electric potential.

Accordingly, when the signal charge of each photodiode is read, electric potentials of two or more transfer electrodes are changed. The two or more transfer electrodes include: one of the transfer electrodes that are adjacent to the transfer electrode (predetermined reading electrode) to which the first potential, that is, reading voltage, is being applied; and the transfer electrode (reading electrode other than the predetermined electrode) whose potential is set to the first potential and which is other than the transfer electrode to which the reading voltage is being applied. Therefore, it is possible to suppress an influence on a variation in electric potential below the transfer electrode to which the reading voltage is applied, compared to the method disclosed in Patent Reference 1. In addition, a potential shape below the transfer electrode is further changed into a slope gradually sloping downward from the photodiode to the transfer electrode. As a result, since a reading residue when reading the signal charge of the photodiode is prevented from occurring, it is possible to reduce the reading voltage even when the transfer electrode adjacent to the reading electrode is smaller than the reading electrode as a result of the miniaturization of the pixels.

Furthermore, wiring that provides the driving pulse to is each transfer electrode may have a shunt wiring structure.

This makes it possible to achieve high-speed transfer of signal charges.

Furthermore, in the transferring, a five- or more phase driving pulse may be applied to each transfer electrode.

Thus, even when the pixels are miniaturized along with miniaturization of a solid-state imaging device and a capability for transferring the signal charges is reduced, a sufficient transfer capability can be ensured, and it is possible to achieve a balance between the miniaturization of the solid-state imaging device and enhancement of image characteristics such as sensitivity characteristics, smear characteristics, and saturation characteristics.

Moreover, in the reading, it may be that while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode is changed after the electric potential of a reading electrode that is included in the reading electrodes and that is other than the predetermined reading electrode is changed. Further, in the reading, it may be that while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are concurrently changed to an electric potential having a reverse polarity with respect to the first electric potential.

Accordingly, the potential shape below the transfer electrode to which the reading voltage is applied is changed into the large slope gradually sloping downward from the photodiode to the transfer electrode. As a result, since the reading residue of the signal charge of the photodiode is highly likely to be prevented from occurring, it is possible to significantly reduce the reading voltage.

Furthermore, another aspect of the present invention may be a solid-state imaging device which includes photodiodes arranged in columns and rows; vertical transfer units each of which is provided for a corresponding one of the columns of the photodiodes and includes transfer electrodes; and a transfer control unit configured to (i) read a signal charge from each of the photodiodes by setting, to a first electric potential, an electric potential of a predetermined reading electrode among reading electrodes that are included in the transfer electrodes, each of the reading electrodes being provided for reading the signal charge from a corresponding one of the photodiodes and for transferring the read signal charge in a column direction, (ii) transfer, in the column direction, the read signal charge by applying, to each of the transfer electrodes, a driving pulse having a second electric potential and a third electric potential, the second electric potential being lower than the first electric potential, and the third electric potential being lower than the second electric potential, and (iii) in the reading of the signal charge, while the first electric potential is being applied to the predetermined reading electrode, set an electric potential of one of the transfer electrodes that are adjacent to the predetermined reading electrode, to the second electric potential, and change an electric potential of the other transfer electrode that is adjacent to the predetermined transfer electrode and an electric potential of a reading electrode that is included in the reading electrodes and that is other than the predetermined reading electrode either from the second electric potential to the third electric potential or from the third electric potential to the second electric potential, in which each of the reading electrodes has a larger area than two of the transfer electrodes that are adjacent to the each of the reading electrodes.

With this, it is possible to reduce the reading voltage.

Effects of the Invention

According to the present invention, it is possible to reduce the reading voltage even when the transfer electrode adjacent to the reading electrode is smaller than the reading electrode as a result of miniaturization of the pixels.

BRIEF DESCRIPTION OF DRAWINGS

FIG. 4A is a timing diagram showing a method of transferring a signal charge in the vertical CCD according to Embodiment 1.

FIG. 4B is a charge transfer conceptual diagram showing the method of transferring the signal charge in the vertical CCD according to Embodiment 1.

FIG. 4C is a potential distribution variation diagram showing the method of transferring the signal charge in the vertical CCD according to Embodiment 1.

FIG. 6A is a timing diagram showing a modification of the method of transferring the signal charge in the vertical CCD according to Embodiment 1.

FIG. 6C is a potential distribution variation diagram showing a modification of the method of transferring the signal charge in the vertical CCD according to Embodiment 1.

FIG. 7A is a timing diagram showing a modification of the method of transferring the signal charge in the vertical CCD according to Embodiment 1.

FIG. 7C is a potential distribution variation diagram showing a modification of the method of transferring the signal charge in the vertical CCD according to Embodiment 1.

FIG. 8A is a timing diagram showing a modification of the method of transferring the signal charge in the vertical CCD according to Embodiment 1.

FIG. 8B is a charge transfer conceptual diagram showing a modification of the method of transferring the signal charge in the vertical CCD according to Embodiment 1.

FIG. 8C is a potential distribution variation diagram showing a modification of the method of transferring the signal charge in the vertical CCD according to Embodiment 1.

FIG. 18A is a timing diagram showing a method of transferring a signal charge in the vertical CCD according to the modification.

FIG. 18B is a charge transfer conceptual diagram showing the method of transferring the signal charge in the vertical CCD according to the modification.

FIG. 18C is a potential distribution variation diagram showing the method of transferring the signal charge in the vertical CCD according to the modification.

FIG. 19A is a timing diagram showing signal charge mixture in the vertical CCD according to the modification.

FIG. 19C is a potential distribution variation diagram showing the signal charge mixture in the vertical CCD according to the modification.

FIG. 20A is a timing diagram showing the method of transferring the signal charge in the vertical CCD according to the modification.

FIG. 20B is a charge transfer conceptual diagram showing the method of transferring the signal charge in the vertical CCD according to the modification.

FIG. 20C is a potential distribution variation diagram showing the method of transferring the signal charge in the vertical CCD according to the modification.

FIG. 21 is a diagram showing a reading residue of a signal charge.

FIG. 22 is a diagram showing a signal charge reading method according to the method of driving the solid-state imaging device disclosed by Patent Reference 1.

NUMERICAL REFERENCES

Figure 1:
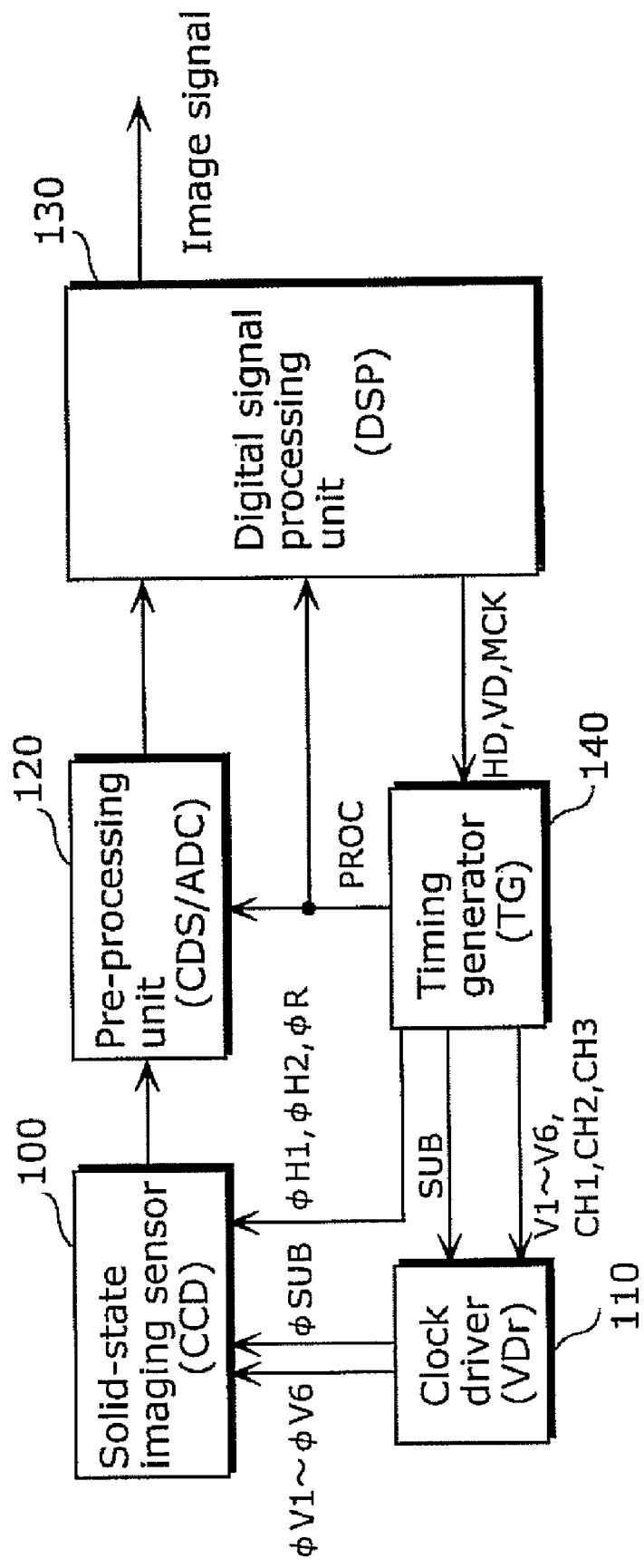
FIG. 1 is a diagram showing a schematic structure of a solid-state imaging device according to Embodiment 1 of the present invention.

100 Solid-state image sensor
110 Clock driver (VDr)
120 Pre-processing unit (CDS/ADC)
130 Digital signal processing unit (DSP)
140 Timing generator (TG)
210, 460, 524 Photodiode
220, 470, 525 Vertical CCD
230 Horizontal CCD
240 Output amplifier
300a, 300b, 300c, 440, 473a, 473b, 473c Conductive light-shielding film
320, 450, 474 Contact
330, 473 Light-shielding film
400 Peripheral wiring
410 φV Electrode
430 Imaging area
471, 471a, 471b, 471c, 523c Transfer electrode
472 Gate insulator film
528 Channel stop

BEST MODE FOR CARRYING OUT THE INVENTION

The following describes a method of driving a solid-state imaging device according to embodiments of the present invention with reference to the drawings.

(Embodiment 1)

FIG. 1 is a diagram showing a schematic structure of a solid-state imaging device according to the present embodiment.

As shown in FIG. 1, the solid-state imaging device includes: a CCD solid-state image sensor 100 which photoelectrically converts incident light and transfers a signal charge generated by the photoelectric conversion; a clock driver (VDr) 110; a pre-processing unit (CDS/ADC) 120 which performs CDS (correlated double sampling) or ADC (analog-digital conversion); a digital signal processing unit (DSP) 130 which performs, for instance, pixel interpolation or brightness and color difference processing, and outputs a video signal; and a timing generator (TG) 140.

The VDr 110 generates driving pulses φV1 to φV6 based on logic signals V1 to V6, and CH1, 2, and 3 that are outputted by the TG 140, provides the driving pulses φV1 to φV6 to the solid-state image sensor 100, and controls charge transfer of a vertical CCD. The driving pulses φV1 to φV6 are pulses having three electric potentials: a high level electric potential $V_H$; a middle level electric potential $V_M$ that is lower than the electric potential $V_H$; and a low level electric potential $V_L$ that is lower than the electric potential $V_M$. For example, the driving pulses φV1 to φV6 are pulses having three electric potentials: 12V as the electric potential $V_H$; φV as the electric potential $V_M$; and −6V as the electric potential $V_L$. It is to be noted that the VDr 110 is an example of a transfer control unit of the present invention.

The TG 140 receives an input of each of pulses of a horizontal synchronization signal HD, a vertical synchronization signal VD, and a clock signal MCK from the DSP 130, generates driving pulses φH1, φH2, and φR to be used for driving the solid-state image sensor 100, and the logic signals V1 to V6, and CH1, 2, and 3, and outputs a signal processing pulse PROC to the pre-processing unit 120 and the DSP 130.

Figure 2:
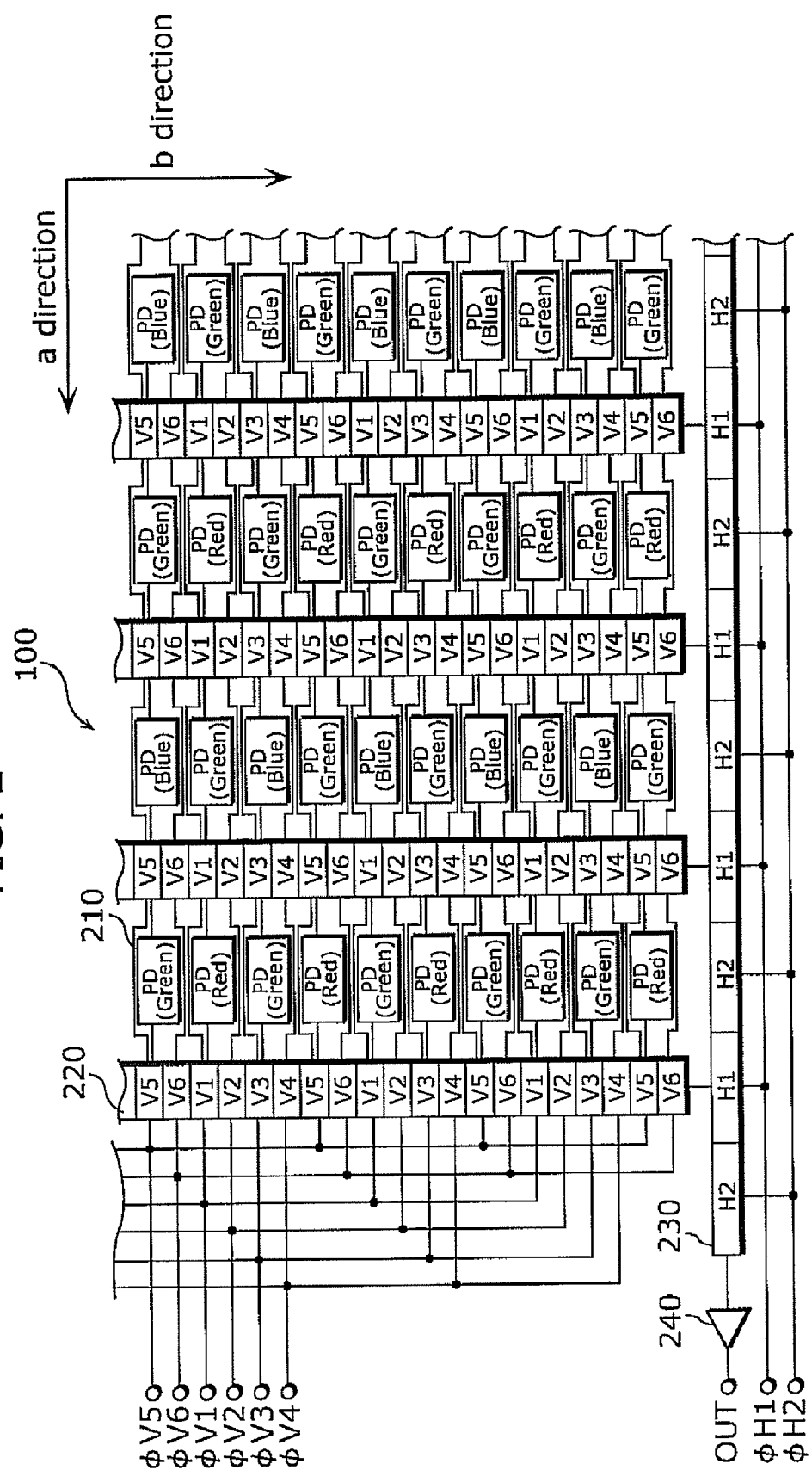
FIG. 2 is a diagram showing a detailed structure of a solid-state image sensor according to Embodiment 1.

FIG. 2 is a diagram showing a detailed structure of the solid-state image sensor 100 according to the present embodiment.

In the solid-state image sensor 100, photodiodes 210, vertical CCDs 220, a horizontal CCD 230, and an output amplifier 240 are formed on a silicon substrate.

The photodiodes 210 are arranged in columns and rows (two-dimension), and accumulate signal charges generated by photoelectric conversion. Each of color filters respectively having one of three colors of red (R), green (G), and blue (B) is placed on a corresponding one of the photodiodes 210.

Each of the vertical CCDs 220 is a six-phase driving CCD which is provided for a corresponding one of the columns of the photodiodes 210 and includes transfer electrodes V1 to V6. The driving pulses φV1 to φV6 are applied to the transfer electrodes V1 to V6, respectively. The vertical CCD 220 transfers, in a column direction (b direction in FIG. 2), signal charges read from the photodiodes 210 according to the application of the driving pulses φV1 to φV6.

The horizontal CCD 230 is a two-phase driving CCD which includes transfer electrodes H1 and H2. The driving pulses φH1 and φH2 are applied to the transfer electrodes H1 and H2, respectively. The horizontal CCD 230 transfers, in a row direction (a direction in FIG. 2), the signal charges transferred by the vertical CCDs 220 according to the application of the driving pulses φH1 and φH2.

Figure 3:
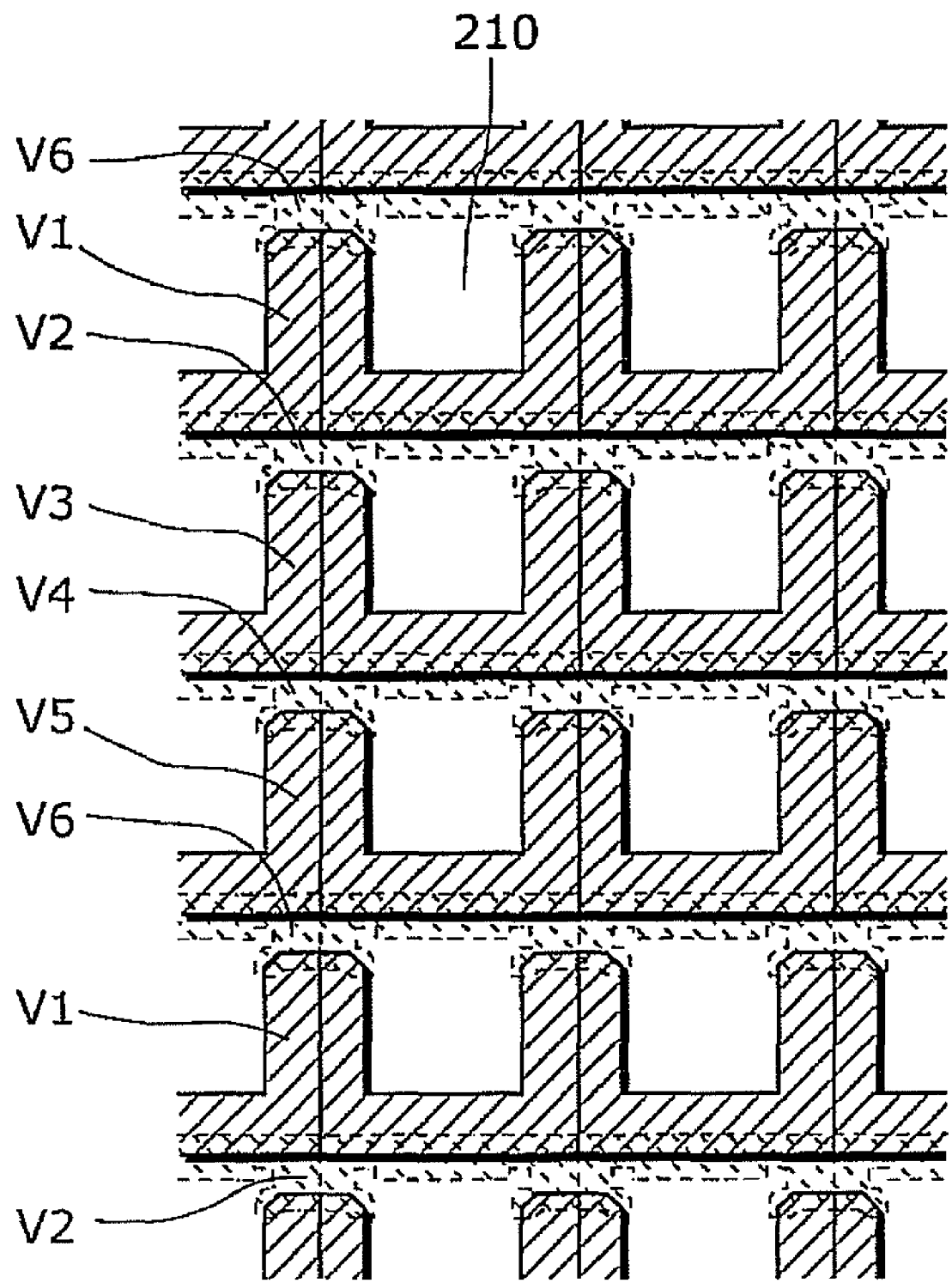
FIG. 3 is a top view showing an electrode structure of a vertical CCD according to Embodiment 1.

FIG. 3 is a top view showing an electrode structure of the vertical CCD 220.

FIG. 3 shows that one of two adjacent transfer electrodes of the vertical CCD 220 has a larger area than the other adjacent transfer electrode. More specifically, transfer electrodes V1, V3, and V5 has a larger area than transfer electrodes V2, V4, and V6. This increases the area of a transfer electrode (reading electrode) which is provided on a reading path of a signal charge of the photodiode 210 and which is provided for reading the signal charge from the photodiode 210 and for transferring the read signal charge in a column direction. In other words, the area of the transfer electrode (reading electrode) to which a reading voltage for reading the signal charge of the photodiode 210, that is, the electric potential $V_H$, is applied becomes larger. As a result, even when pixels are miniaturized, it is possible to ensure a reading channel width necessary for reading a signal charge.

Figure 9:
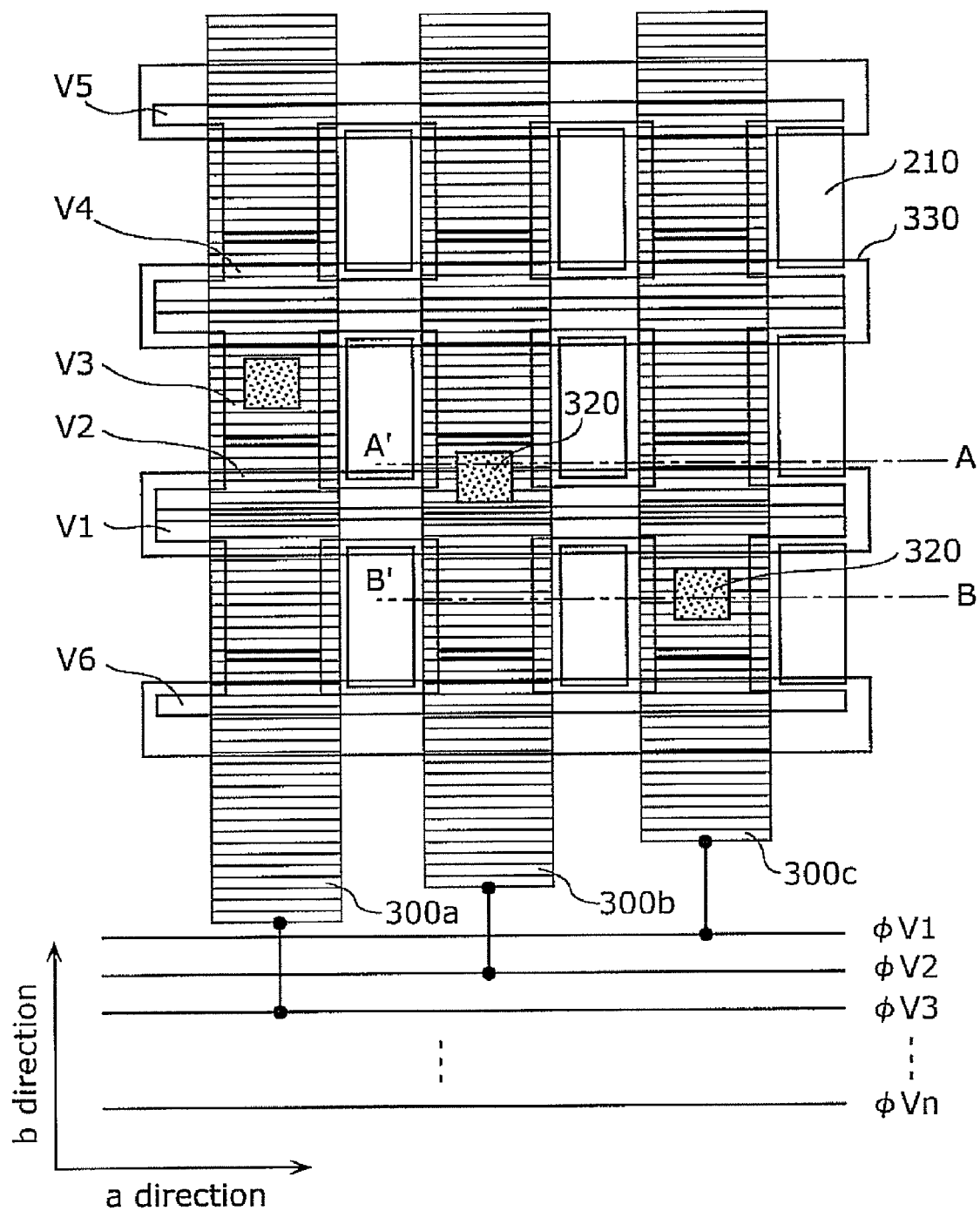
FIG. 9 is a top view showing a structure of a solid-state imaging device (solid-state image sensor) according to Embodiment 2 of the present invention.

It is to be noted that although the two adjacent transfer electrodes of the vertical CCD 220 are formed with a double-layered structure in which parts of the transfer electrodes overlap with each other and has the double-layered structure as shown in FIG. 3, the solid-state imaging device according to the present embodiment of the present invention may have a single-layered structure in which the two adjacent transfer electrodes of the vertical CCD 220 do not overlap with each other and the two transfer electrodes are in contact with each other as shown in FIG. 9 to be described later. In the case of the single-layered structure, it is possible to reduce coupling capacitance between transfer electrodes.

FIGS. 4A to 4C each are a diagram showing a method of transferring a signal charge in the vertical CCD 220 having the above structure. FIG. 4A is a timing diagram showing the method of transferring, FIG. 4B is a charge transfer conceptual diagram showing the method of transferring, and FIG. 4C is a potential distribution variation diagram showing the method of transferring. It is to be noted that the method of transferring is an example of the method of driving the solid-state imaging device according to the present invention.

At a time t1, the driving pulse φV4 is at a low level, and the electric potential $V_L$ is applied to the transfer electrode V4. Consequently, a potential well for accumulating signal charges is formed below the transfer electrodes V1 to V3 and V5 to V6.

At a time t2, the driving pulse φV1 is at a high level, and the electric potential $V_H$ is applied to the transfer electrode V1 that is a predetermined reading electrode among a plurality of reading electrodes. As a result, a signal charge of the photodiode 210 provided for the transfer electrode V1 is read into below the transfer electrode V1. When the electric potential $V_H$ is applied to the transfer electrode V1, the driving pulse φV2 is at a middle level and the electric potential $V_M$ is applied to the transfer electrode V2 that is one of the transfer electrodes adjacent to the transfer electrode V1.

At a time t3, the driving pulse φV5 is changed into an electric potential having a reverse polarity with respect to the driving pulse φV1 so as to be at a low level, and the electric potential of the transfer electrode V5 is changed into the electric potential $V_L$ having a reverse polarity with respect to the electric potential $V_H$. This can suppress an influence on variation in electric potential below the transfer electrode V1 that contributes to reading a signal charge, and a potential shape below the transfer electrode V1 is changed into a large slope gradually sloping downward from the photodiode 210 to the vertical CCD 220. Consequently, a reading residue when reading the signal charge of the photodiode 210 to the vertical CCD 220 can be prevented from occurring. In the present invention, the electric potentials of the transfer electrodes which have larger areas (in the present embodiment, the transfer electrodes V1, V3, and V5 have larger areas) and to which reading voltage is applied when subsequent reading of the signal charge are changed. The transfer electrodes are other than predetermined transfer electrodes to which reading voltage is being applied among transfer electrodes (reading electrodes) to which reading voltage is applied. Accordingly, the reading residue can be further prevented from occurring, compared to the technique disclosed in Patent Reference 1.

At a time t4, the driving pulse φV6 is changed into an electric potential having a reverse polarity with respect to the driving pulse φV1 so as to be at a low level, and the electric potential of the transfer electrode V6 is changed into the electric potential $V_L$ having a reverse polarity with respect to the electric potential $V_H$. This further changes the potential shape below the transfer electrode V1 that contributes to reading the signal charge. As a result, the reading residue when reading the signal charge of the photodiode 210 to the vertical CCD 220 is highly likely to be prevented from occurring.

At a time t5, the driving pulse φV1 is at a middle level, and the electric potential $V_M$ is applied to the transfer electrode V1.

Consequently, the read signal charge is transferred to the potential well below the transfer electrodes V1 to V3.

At a time t6, the driving pulse φV4 is at a middle level, and the electric potential $V_M$ is applied to the transfer electrode V4. As a result, the read signal charge is transferred to the potential well below the transfer electrodes V1 to V4 and V6.

Figure 5A:
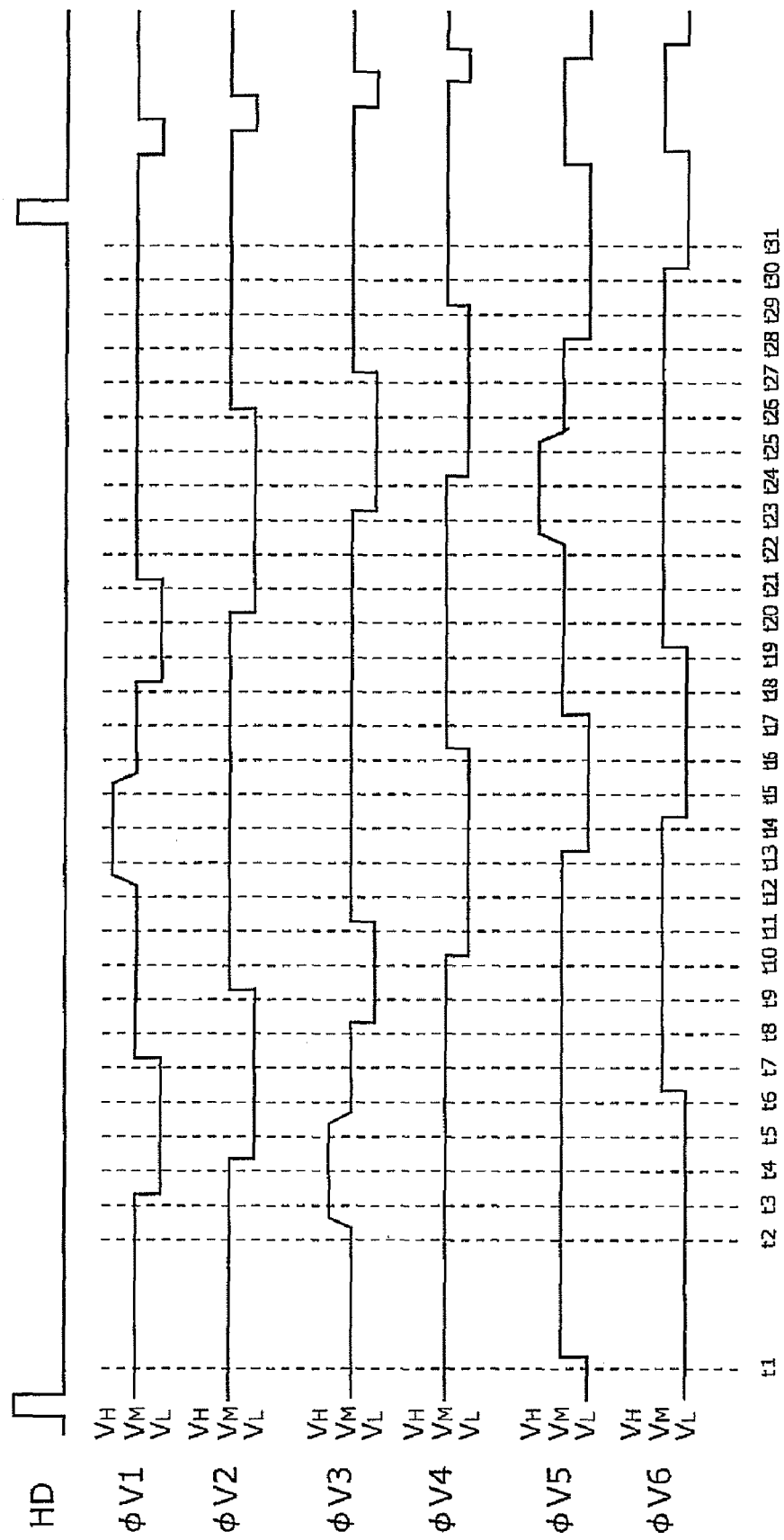
FIG. 5A is a timing diagram showing signal charge mixture in the vertical CCD according to Embodiment 1.
Figure 5B:
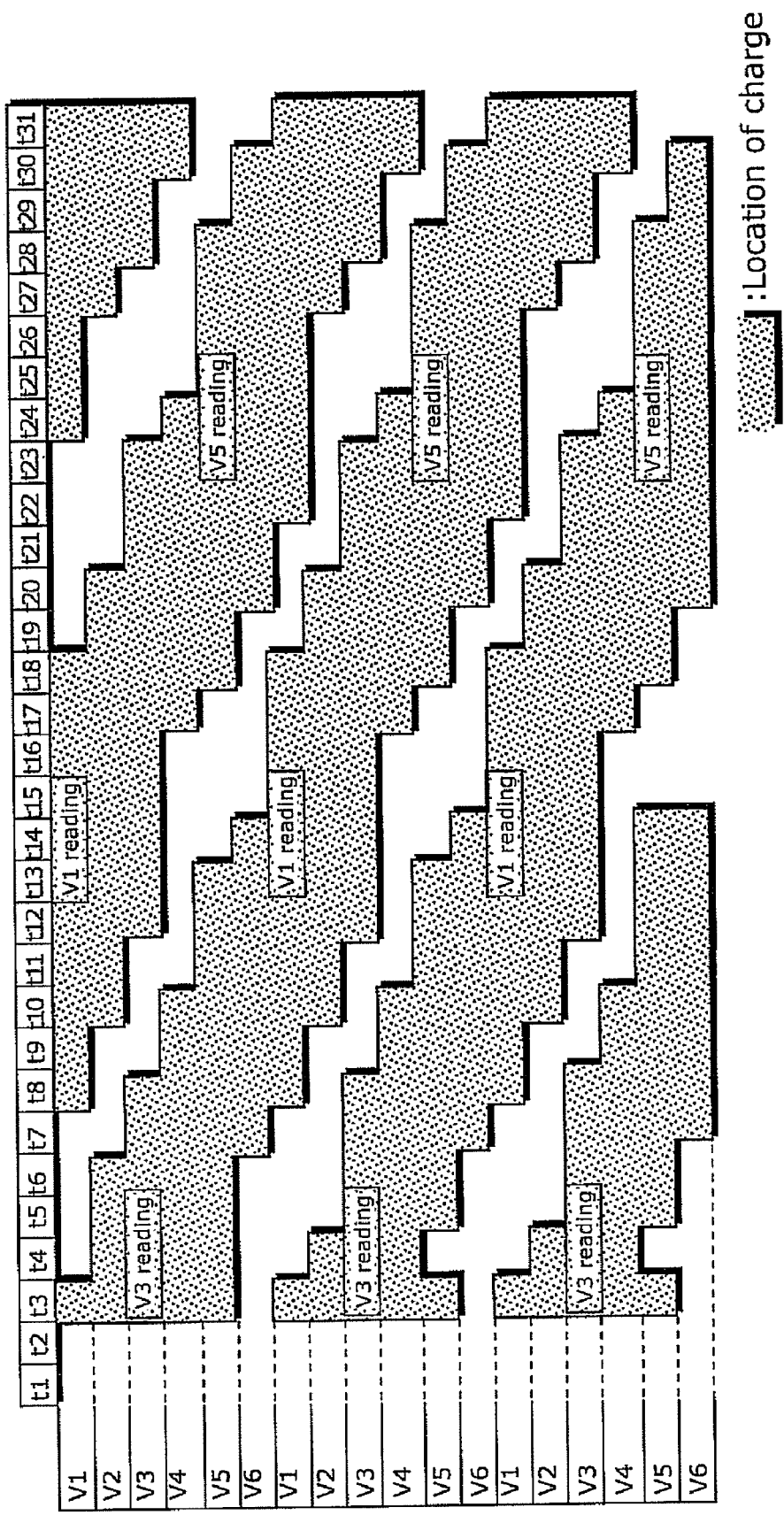
FIG. 5B is a charge mixture transfer conceptual diagram showing signal charge mixture in the vertical CCD according to Embodiment 1.
Figure 5C:
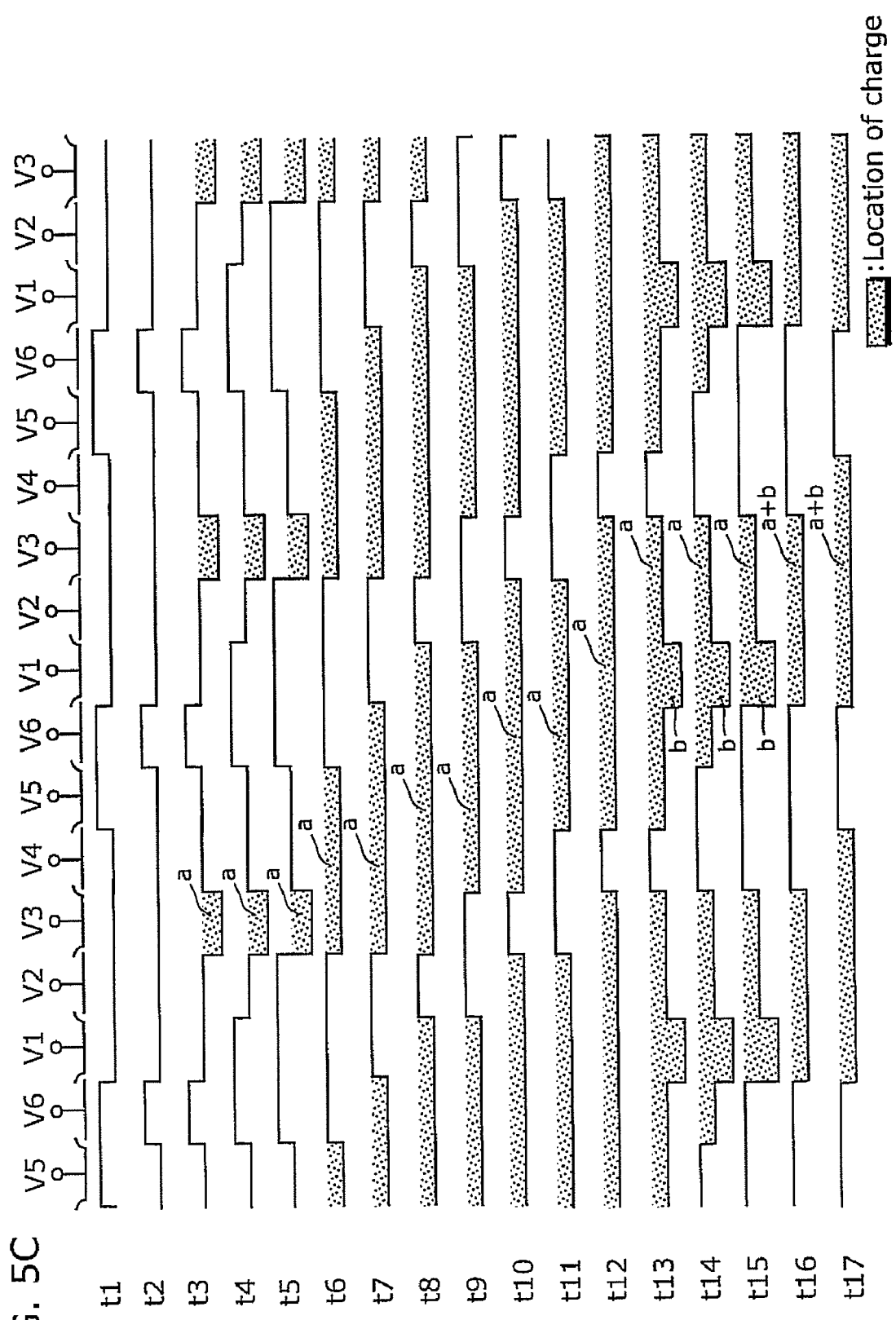
FIG. 5C is a potential distribution variation diagram showing signal charge mixture in the vertical CCD according to Embodiment 1.
Figure 5D:
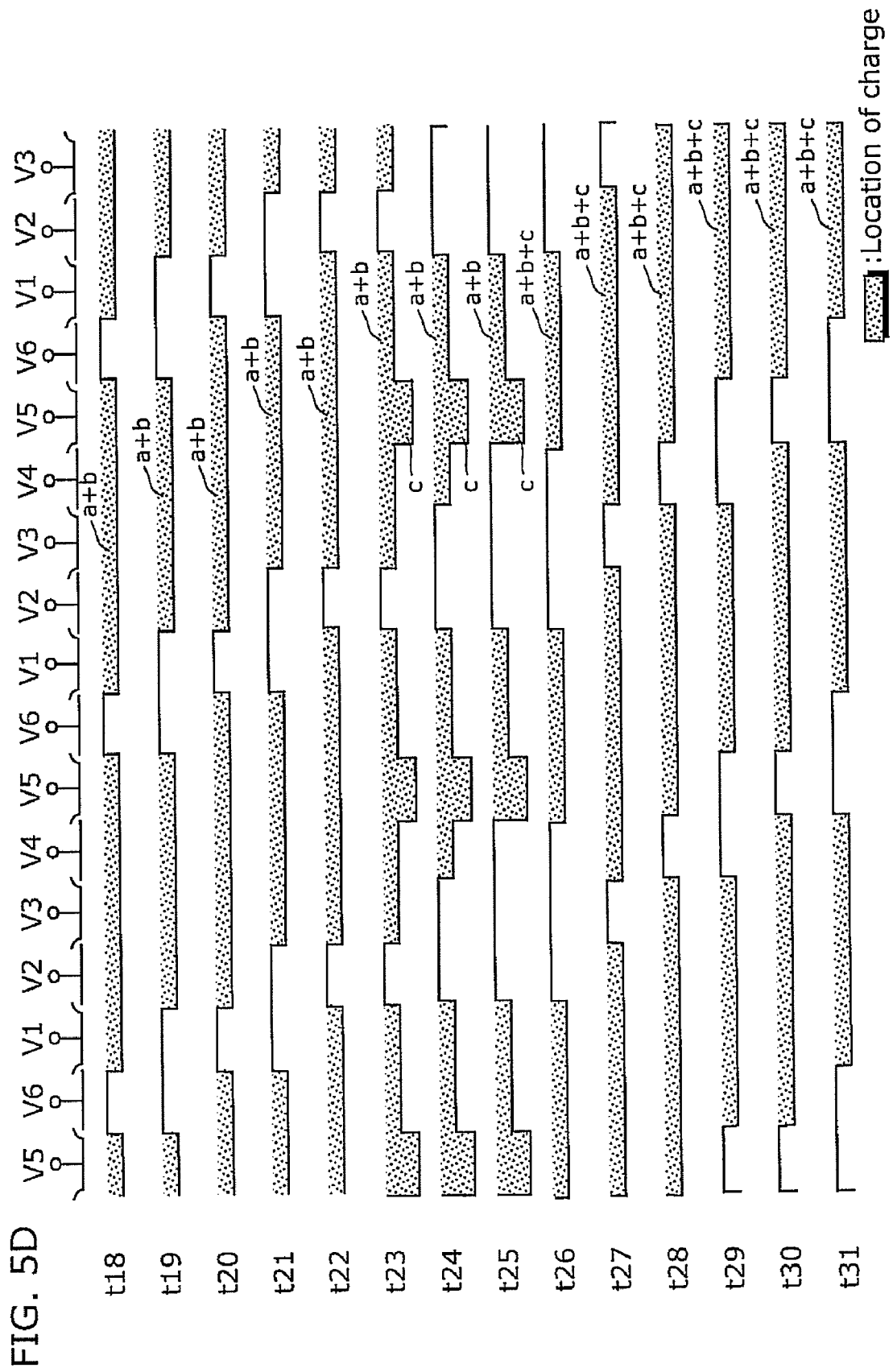
FIG. 5D is a potential distribution variation diagram showing signal charge mixture in the vertical CCD according to Embodiment 1.

FIGS. 5A to 5D each are a diagram showing signal charge mixture (pixel mixture) in the vertical CCD 220 having the above structure. FIG. 5A is a timing diagram showing the signal charge mixture, FIG. 5B is a charge mixture transfer conceptual diagram showing the signal charge mixture; and FIGS. 5C and 5D each are a potential distribution variation diagram showing the signal charge mixture.

At a time t1, the driving pulses φV5 and φV6 are at a low level, and the electric potential $V_L$ is applied to the transfer electrodes V5 and V6. Consequently, a potential well for accumulating signal charges is formed below the transfer electrodes V1 to V4.

At a time t2, the driving pulse φV5 is at a middle level, and the electric potential $V_M$ is applied to the transfer electrode V5. Consequently, a potential well for accumulating signal charges is formed below the transfer electrodes V1 to V5.

At a time t3, the driving pulse φV3 is at a high level, and the electric potential $V_H$ is applied to the transfer electrode V3 that is a predetermined reading electrode among a plurality of reading electrodes. Consequently, a signal charge (a in FIG. 5C) of the photodiode 210 provided for the transfer electrode V3 is read into below the transfer electrode V3. While the electric potential $V_H$ is being applied to the transfer electrode V3, the electric potential $V_M$ is applied to the transfer electrode V4 that is one of the transfer electrodes adjacent to the transfer electrode V3.

At a time t4, the driving pulse φV1 is changed into an electric potential having a reverse polarity with respect to the driving pulse φV3 so as to be at a low level, and the electric potential of the transfer electrode V1 is changed into the electric potential $V_L$ having a reverse polarity with respect to the electric potential $V_H$. Since this can suppress an influence on variation in electric potential below the transfer electrode V3 that contributes to reading a signal charge, and further change a potential shape below the transfer electrode V3 into a large slope gradually sloping downward from the photodiode 210 to the vertical CCD 220, a reading residue is prevented from occurring. In the present invention, the electric potentials of the transfer electrodes which have larger areas (in the present embodiment, the transfer electrodes V1, V3, and V5 have larger areas) and to which reading voltage is applied when subsequent reading of the signal charge are changed. The transfer electrodes are other than predetermined transfer electrodes to which reading voltage is being applied among transfer electrodes (reading electrodes) to which reading voltage is applied. Accordingly, the reading residue can be further prevented from occurring, compared to the technique disclosed in Patent Reference 1.

At a time t5, the driving pulse φV2 is changed into an electric potential having a reverse polarity with respect to the driving pulse φV3 so as to be at a low level, and the electric potential of the transfer electrode V2 is changed into the electric potential $V_L$ having a reverse polarity with respect to the electric potential $V_H$. Since this further changes the potential shape below the transfer electrode V3 that contributes to reading a signal charge, the reading residue is highly likely to be prevented from occurring.

At a time t6, the driving pulse φV3 is at a middle level, and the electric potential $V_M$ is applied to the transfer electrode V3.

As a result, the read signal charge is transferred to the potential well below the transfer electrodes V3 to V5.

At times t7 to t12, the read signal charges are transferred to the potential well below the transfer electrodes V1 to V3, V5, and V6 by changing the electric potentials of the driving pulses φV1 to φV4 and φV6.

At a time t13, the driving pulse φV1 is at a high level, and the electric potential $V_H$ is applied to the transfer electrode V1 that is a predetermined reading electrode among a plurality of reading electrodes. Consequently, a signal charge (b in FIG. 5C) of the photodiode 210 provided for the transfer electrode V1 is read into below the transfer electrode V1, and the read signal charge is mixed with the already-read signal charge (a in FIG. 5C). While the electric potential $V_H$ is being applied to the transfer electrode V1, the electric potential $V_M$ is applied to the transfer electrode V2 that is one of the transfer electrodes adjacent to the transfer electrode V1.

At a time t14, the driving pulse φV5 is changed into an electric potential having a reverse polarity with respect to the driving pulse φV1 so as to be at a low level, and the electric potential of the transfer electrode V5 is changed into the electric potential $V_L$ having a reverse polarity with respect to the electric potential $V_H$. Since this can suppress an influence on variation in electric potential below the transfer electrode V1 that contributes to reading a signal charge, and further change a potential shape below the transfer electrode V1 into a large slope gradually sloping downward from the photodiode 210 to the vertical CCD 220, a reading residue is prevented from occurring.

At a time t15, the driving pulse φV6 is changed into an electric potential having a reverse polarity with respect to the driving pulse φV1 so as to be at a low level, and the electric potential of the transfer electrode V6 is changed into the electric potential $V_L$ having a reverse polarity with respect to the electric potential $V_H$. Since this further changes the potential shape below the transfer electrode V1 that contributes to reading a signal charge, the reading residue is highly likely to be prevented from occurring.

At times t16 to t22, the same operations performed between t6 to t12 are performed, and mixed signal charges (a+b in FIG. 5C) are transferred to the potential well below the transfer electrodes V3 to V6 and V1.

At a time t23, the driving pulse φV5 is at a high level, and the electric potential $V_H$ is applied to the transfer electrode V5 that is a predetermined reading electrode among a plurality of reading electrodes. As a result, a signal charge (c in FIG. 5D) of the photodiode 210 provided for the transfer electrode V5 is read into below the transfer electrode V5, and the read signal charge is mixed with an already-mixed signal charge (a+b in FIG. 5D). While the electric potential $V_H$ is being applied to the transfer electrode V5, the electric potential $V_M$ is applied to the transfer electrode V6 that is adjacent to the transfer electrode V5.

At a time t24, the driving pulse φV3 is changed into an electric potential having a reverse polarity with respect to the driving pulse φV5 so as to be at a low level, and the electric potential of the transfer electrode V3 is changed into the electric potential $V_L$ having a reverse polarity with respect to the electric potential $V_H$. Since this can suppress an influence on variation in electric potential below the transfer electrode V5 that contributes to reading a signal charge, and further change a potential shape below the transfer electrode V5 into a large slope gradually sloping downward from the photodiode 210 to the vertical CCD 220, a reading residue is prevented from occurring.

At a time t25, the driving pulse φV4 is changed into an electric potential having a reverse polarity with respect to the driving pulse φV5 so as to be at a low level, and the electric potential of the transfer electrode V4 is changed into the electric potential $V_L$ having a reverse polarity with respect to the electric potential $V_H$. Since this further changes the potential shape below the transfer electrode V5 that contributes to reading a signal charge, the reading residue is highly likely to be prevented from occurring.

At times t26 to t31, mixed signal charges (a+b+c in FIG. 5D) are transferred to the horizontal CCD 230.

As described above, in the method of transferring the signal charge according to the present embodiment, when the signal charge of the photodiode 210 is read, the electric potential $V_M$ is applied to one of the transfer electrodes adjacent to the transfer electrode (for example, the transfer electrode V1 in FIGS. 4A to 4C) to which the electric potential $V_H$ that is the reading voltage is being applied. The electric potentials of two transfer electrodes that are the other transfer electrode that is adjacent to the transfer electrode to which the reading voltage is being applied (for example, the transfer electrode V6 in FIGS. 4A to 4C) and another transfer electrode which is other than the transfer electrode to which the reading voltage is being applied. A reading voltage is applied to the another transfer electrode at different timing. Thus, the influence on the variation in electric potential below the transfer electrode to which the reading voltage is applied can be suppressed, and the potential shape below the transfer electrode is further changed into a large slope gradually sloping downward from the photodiode 210 to the vertical CCD 220. Consequently, since the reading residue when reading the signal charge of the photodiode 210 to the vertical CCD 220 can be prevented from occurring, the reading voltage can be reduced. In the present invention, the electric potentials of the transfer electrodes having a larger area (V1, V3 and V5 in the present embodiment) are changed; and thus, the reading residue can be further prevented compared to the technique disclosed in Patent Reference 1. When the reading residue occurs, an image defect such as surface roughness of an image occurs because a variation in an amount of signal charge read for each of the photodiodes 210 occurs. Therefore, preventing the reading residue from occurring leads to prevention of the image defect.

Moreover, in the method of transferring the signal charge according to the present embodiment, it has been described that the electric potentials of two transfer electrodes are changed. The two transfer electrodes include one of the transfer electrodes that are adjacent to the transfer electrode to which the reading voltage is being applied and another transfer electrode to which reading voltage is applied at different timing and which is other than the transfer electrode to which the reading voltage is being applied. However, it may be that the electric potentials of three transfer electrodes including the two transfer electrodes are changed. Furthermore, the electric potential of the transfer electrodes whose electric potentials have once been changed may be changed multiple times.

Figure 6B:
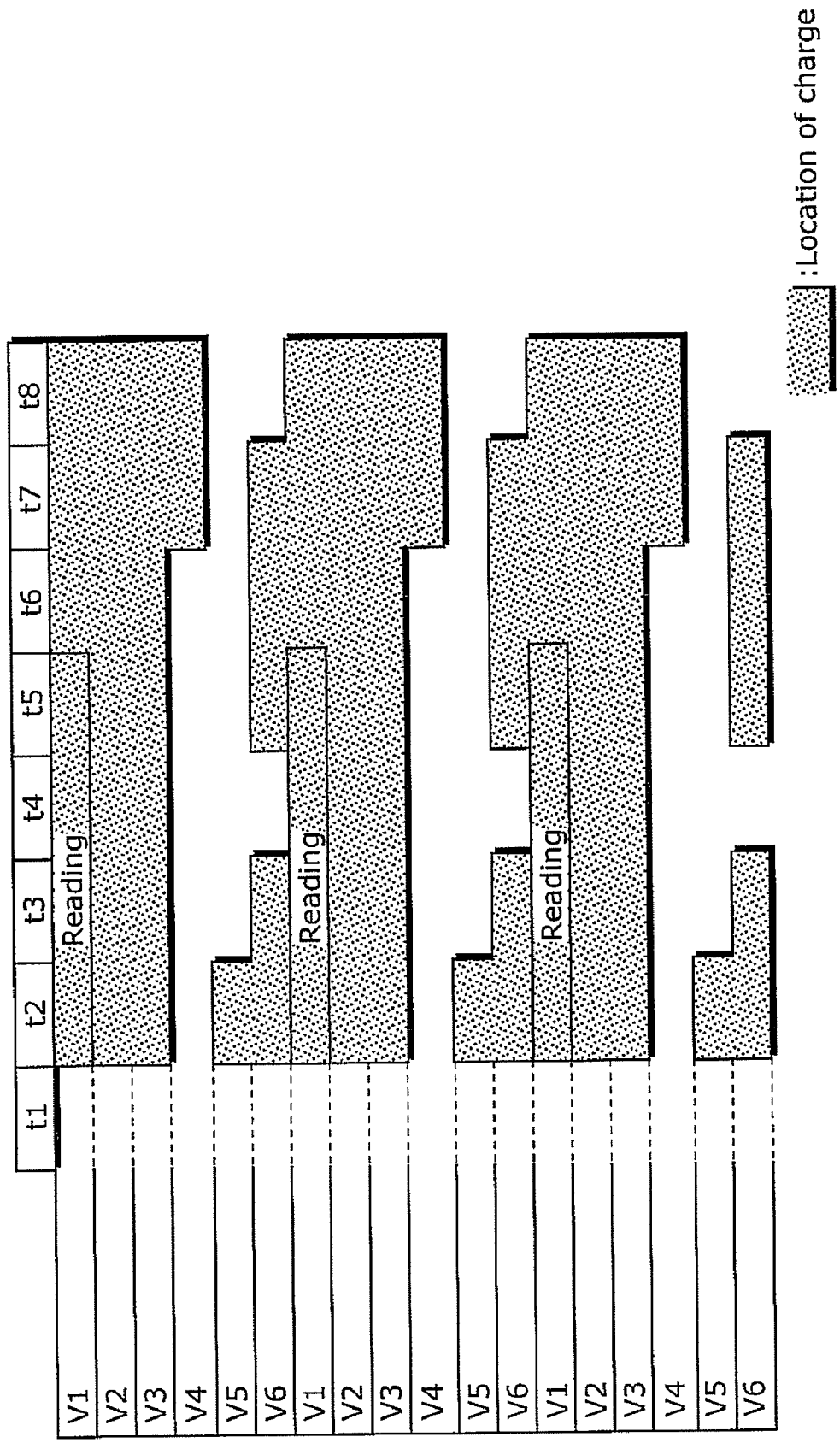
FIG. 6B is a charge transfer conceptual diagram showing a modification of the method of transferring the signal charge in the vertical CCD according to Embodiment 1.
Figure 7B:
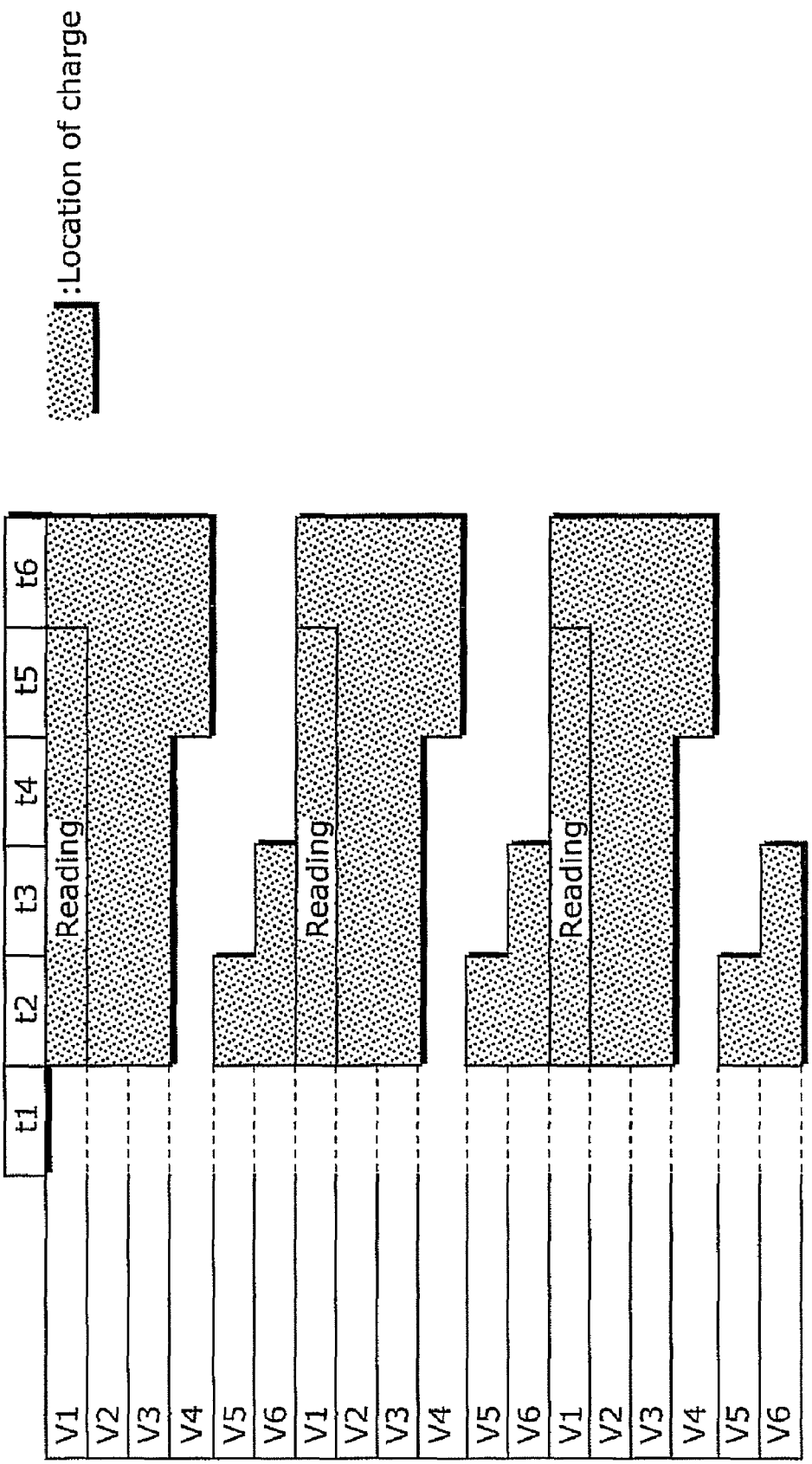
FIG. 7B is a charge transfer conceptual diagram showing a modification of the method of transferring the signal charge in the vertical CCD according to Embodiment 1.

FIGS. 6A to 6C and FIGS. 7A to 7C each are a diagram showing the method of transferring the signal charge in the above case. FIGS. 6A and 7A each are a timing diagram showing the method of transferring, FIGS. 6B and 7B each are a charge transfer conceptual diagram showing the method of transferring, and FIGS. 6C and 7C each are a potential distribution variation diagram showing the method of transferring.

The method of transferring the signal charge shown in FIGS. 6A to 6C differs from the method of transferring the signal charge shown in FIG. 4A to FIG. 4C in that after the driving pulse φV6 is changed to be at a low level (the electric potential of the transfer electrode V6 is $V_L$) at a time t4, at a time t5, the driving pulse φV6 is changed to a middle level again, and only the electric potential of the transfer electrode V6 is changed into the electric potential $V_M$. The method of transferring the signal charge in FIGS. 7A to 7C differs from the method of transferring the signal charge shown in FIG. 4A to 4C in that at a time t5, only the driving pulse φV4 is changed to be at a middle level and only the electric potential of the transfer electrode V4 is changed into the electric potential $V_M$. In any of the above cases, since a potential well becomes larger in comparison with the method of transferring the signal charge according to the present embodiment, it is possible to increase the charge transfer capability. Accordingly, even when pixels are refined along with miniaturization of a solid-state imaging device and a transfer capability of a vertical CCD is reduced, a sufficient transfer capability can be ensured, and it is possible to achieve a balance between the miniaturization of the solid-state imaging device and enhancement of image characteristics such as sensitivity characteristics, smear characteristics, and saturation characteristics.

Further, in the method of transferring the signal charge according to the present embodiment, it has been described that after the electric potential of one of two transferring electrodes is changed, the electric potential of the other transfer electrode is changed, while the reading voltage is being applied. However, the electric potentials of the two transfer electrodes may be concurrently changed. FIGS. 8A to 8C each are a diagram showing the method of transferring the signal charge in the above case. FIG. 8A is a timing diagram showing the method of transferring, FIG. 8B is a charge transfer conceptual diagram showing the method of transferring, and FIG. 8C is a potential distribution variation diagram showing the method of transferring.

The above method of transferring the signal charge differs from the method of transferring the signal charge shown in FIGS. 4A to 4C in that at a time t3, the driving pulses φV5 and φV6 are concurrently changed to be at a low level, and the electric potentials of the transfer electrodes V5 and V6 are concurrently changed into the electric potential $V_L$.

(Embodiment 2)

A solid-state imaging device according to the present embodiment differs from the solid-state imaging device according to Embodiment 1 in that wiring which provides driving pulses to transfer electrodes V1 to V6 has a shunt wiring structure. Stated differently, in the solid-state imaging device according to the present embodiment, a light-shielding film which is provided above a vertical CCD and prevents light from being incident on a vertical charge transfer path of the vertical CCD (VCCD) is a conductive light-shielding film, and functions as wiring that provides driving pulses to transfer electrodes of the vertical CCD.

Figure 10A:
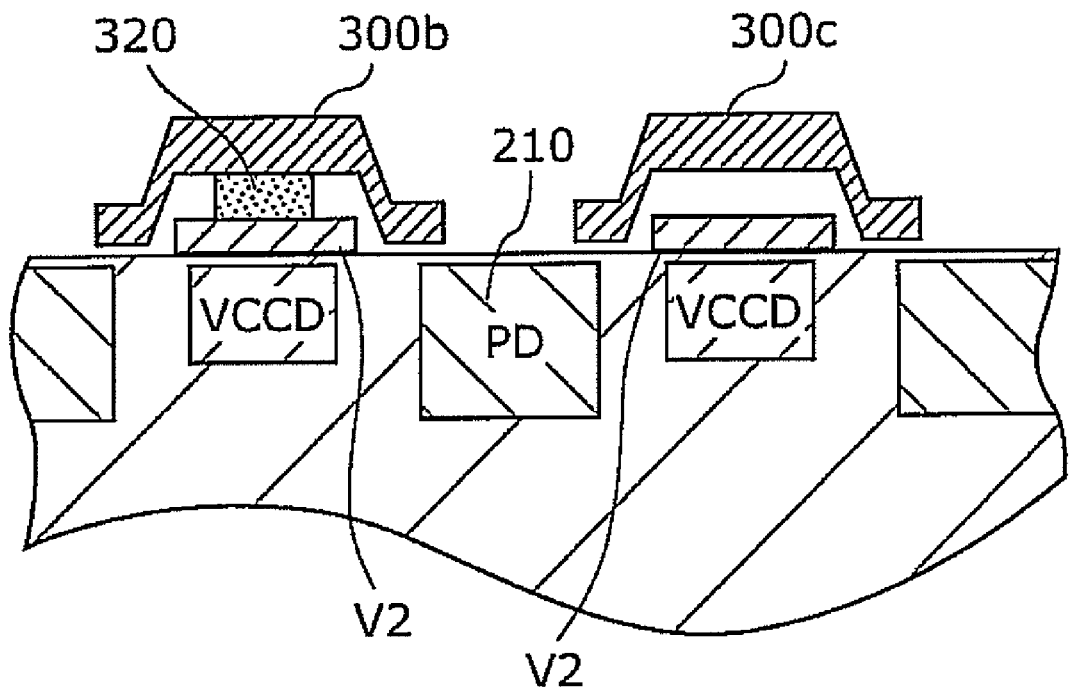
FIG. 10A is a cross section view (cross section view along the line A-A' in FIG. 9) of the solid-state image sensor according to Embodiment 2.
Figure 10B:
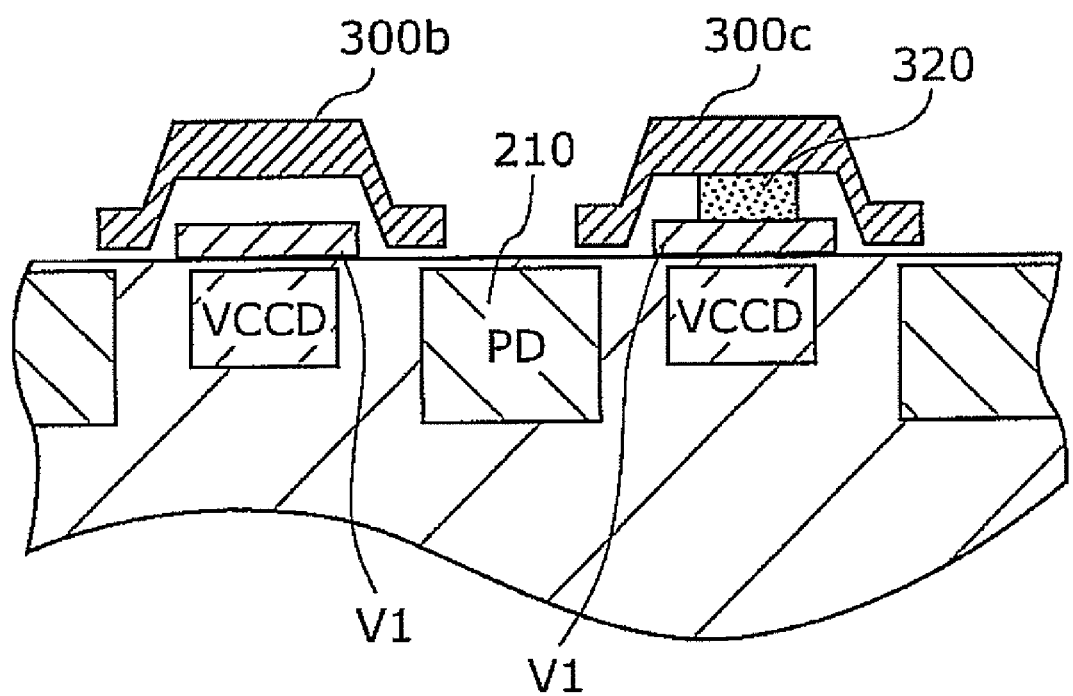
FIG. 10B is a cross section view (cross section view along the line B-B' in FIG. 9) of the solid-state image sensor according to Embodiment 2.

FIG. 9 is a top view showing a structure of the solid-state imaging device (solid-state image sensor) according to the present embodiment. FIG. 10A is a cross section view (cross section view along the line A-A' in FIG. 9) of the solid-state image sensor. FIG. 10B is a cross section view (cross section view along the line B-B' in FIG. 9) of the solid-state image sensor.

The solid-state image sensor includes: conductive light-shielding films 300a, 300b, and 300c that are provided above the vertical CCD, that is, the transfer electrodes V1 to V6 and that extend in a column direction (b direction in FIG. 9); and a light-shielding film 330 that extends in a row direction (a direction in FIG. 9). Each of the conductive light-shielding films 300a, 300b, and 300c is electrically isolated in a row direction. The conductive light-shielding film 300a is electrically connected to the transfer electrode V3 via a contact 320, and provides the driving pulse φV3 to the transfer electrode V3. The conductive light-shielding film 300b is electrically connected to the transfer electrode V2 via the contact 320, and provides the driving pulse φV2 to the transfer electrode V2. The conductive light-shielding film 300c is electrically connected to the transfer electrode V1 via the contact 320, and provides the driving pulse φV1 to the transfer electrode V1.

As described above, in the solid-state imaging device according to the present embodiment, the signal charges are transferred in the vertical CCD with the same method of transferring the signal charge as Embodiment 1. Thus, it is possible to reduce the reading voltage.

Moreover, in the solid-state imaging device according to the present embodiment, the wiring that provides the driving pulses to the transfer electrodes V1 to V6 of the solid-state image sensor has the shunt wiring structure. Thus, it is possible to transfer the signal charges at high speed. This will be described in detail later.

Figure 11A:
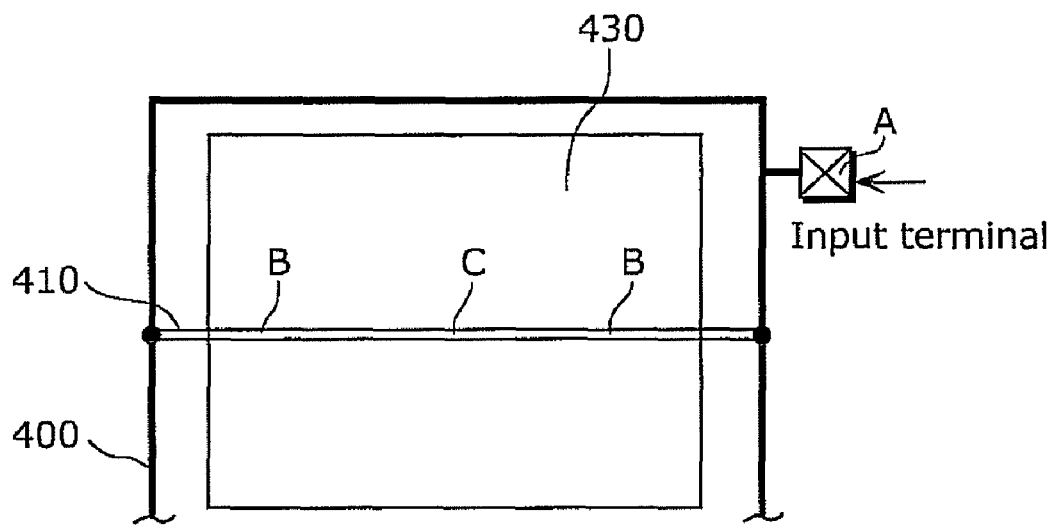
FIG. 11A is a top view showing a structure of the solid-state image sensor in which wiring that provides a driving pulse to a transfer electrode does not have a shunt wiring structure.
Figure 11B:
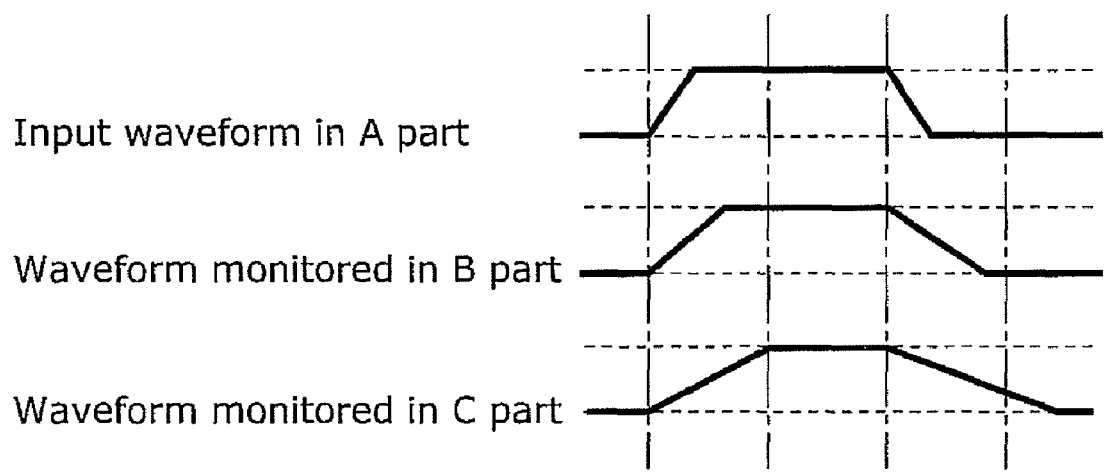
FIG. 11B is a diagram showing a waveform of a driving pulse in each part in the solid-state image sensor.
Figure 12A:
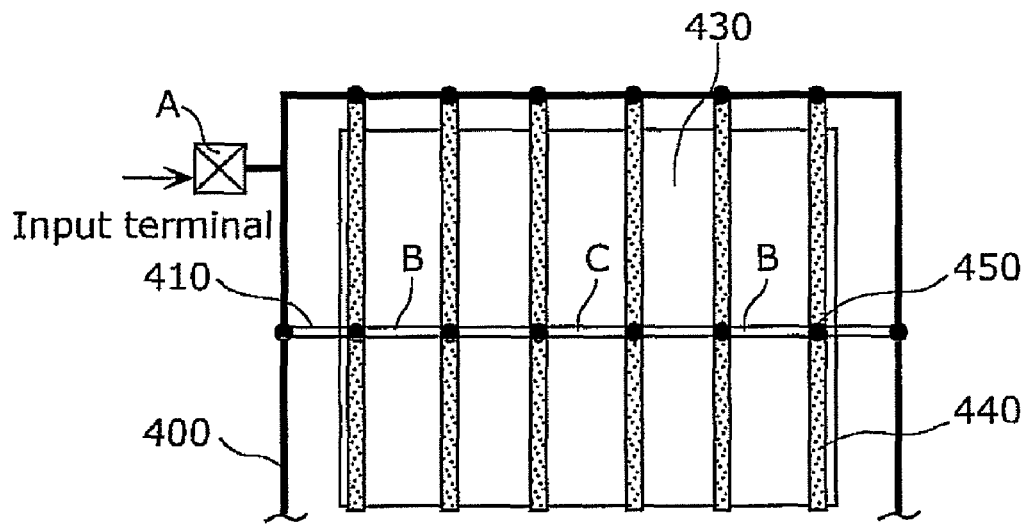
FIG. 12A is a top view showing a structure of the solid-state image sensor in which wiring that provides a driving pulse to a transfer electrode has a shunt wiring structure.
Figure 12B:
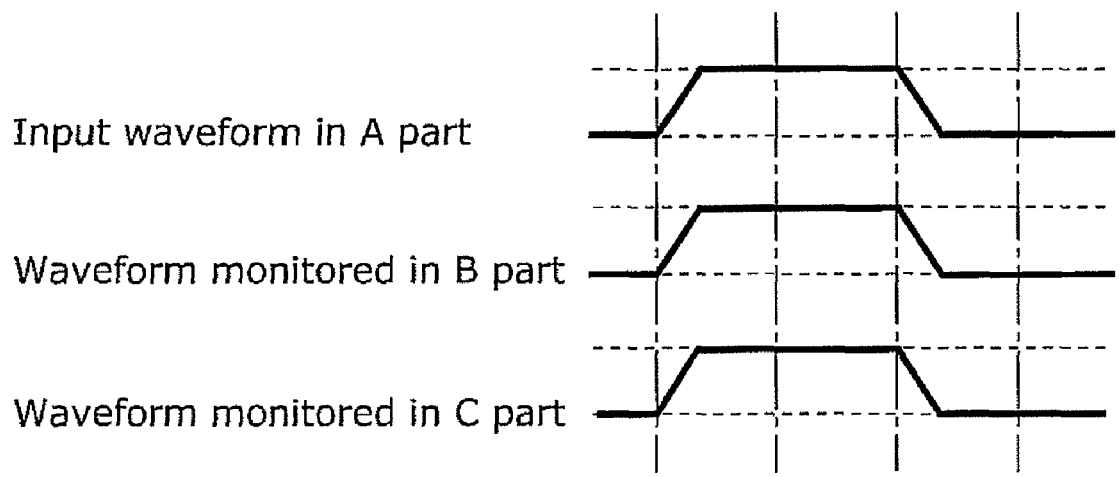
FIG. 12B is a diagram showing a waveform of a driving pulse in each part in the solid-state image sensor.

FIG. 11A is a top view showing a structure of a solid-state image sensor in which wiring that provides a driving pulse to a transfer electrode does not have a shunt wiring structure, and FIG. 11B is a diagram showing a waveform of a driving pulse in each part in the solid-state image sensor. FIG. 12A is a top view showing a structure of a solid-state image sensor in which wiring that provides a driving pulse to a transfer electrode has a shunt wiring structure, and FIG. 12B is a diagram showing a waveform of a driving pulse in each part in the solid-state image sensor.

In any of the solid-state image sensors, peripheral wiring 400 made of a metal material is connected to an input terminal, and a φV electrode 410 made of a polysilicon material is connected to the peripheral wiring 400. Since resistance components of the polysilicon material are high, a waveform of a driving pulse transmitted to the φV electrode 410 becomes dull. Since this becomes more remarkable as a wiring distance from the input terminal is longer, as shown in FIG. 11B, waveforms at the input terminal (A part in FIG. 11A), a peripheral part (B part in FIG. 11A) of an imaging region 430, and a central part (C part in FIG. 11A) differ in pattern from each other. As a result, a transfer speed of the vertical CCD is reduced, and a charge transfer capability differs between at the peripheral part and at the central part of the imaging region 430.

However, in the solid-state image sensor shown in FIG. 12A, a conductive light-shielding film 440 that is made of a metal material such as tungsten is connected to the peripheral wiring 400 and the φV electrode 410 via a contact 450. Since resistance components of the metal material are low, a waveform of a driving pulse transmitted to the conductive light-shielding film 440 hardly becomes dull. Thus, as shown in FIG. 12B, waveforms of driving pulses at an input terminal (A part in FIG. 12A), a peripheral part of the imaging region 430 (B part in FIG. 12A), and a central part (C part in FIG. 12A) become substantially identical to each other. As a result, the transfer speed of the vertical CCD is not reduced, and a difference in the charge transfer capability between at the peripheral part and at the central part of the imaging region 430 disappears.

On the other hand, the solid-state image sensor in which the wiring that provides the driving pulse to the transfer electrode has the shunt wiring structure enables signal charge transfer at high speed but deteriorates transfer efficiency for signal charges of the vertical CCD. Thus, an image defect within an imaging region occurs which is not saliently seen in the solid-state image sensor in which the wiring that provides the driving pulse to the transfer electrode does not have the shunt wiring structure. The following describes this in detail.

Figure 13:
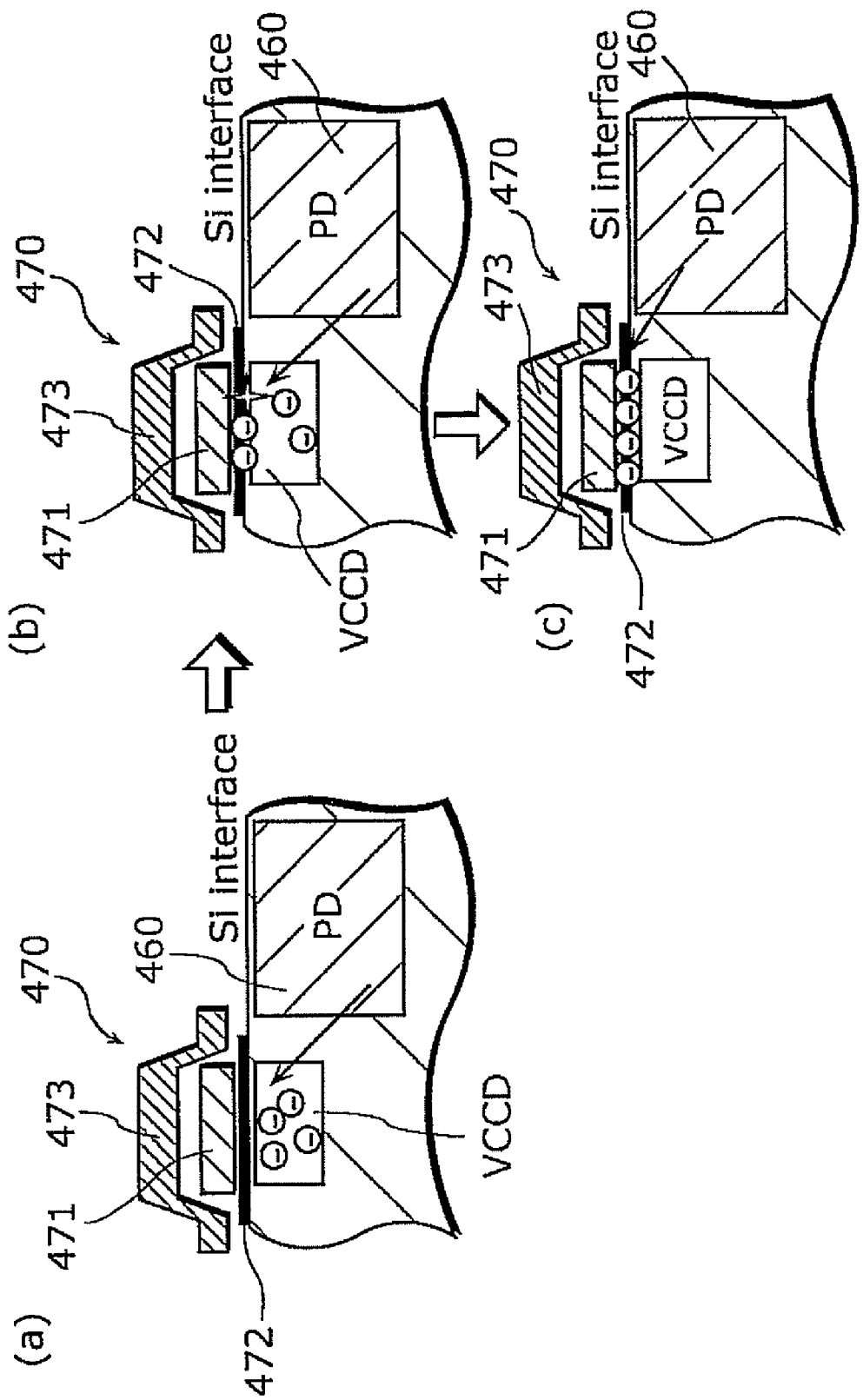
FIG. 13 is a cross section view of a solid-state image sensor for describing a mechanism in which transfer efficiency of a vertical CCD is deteriorated.
Figure 14:
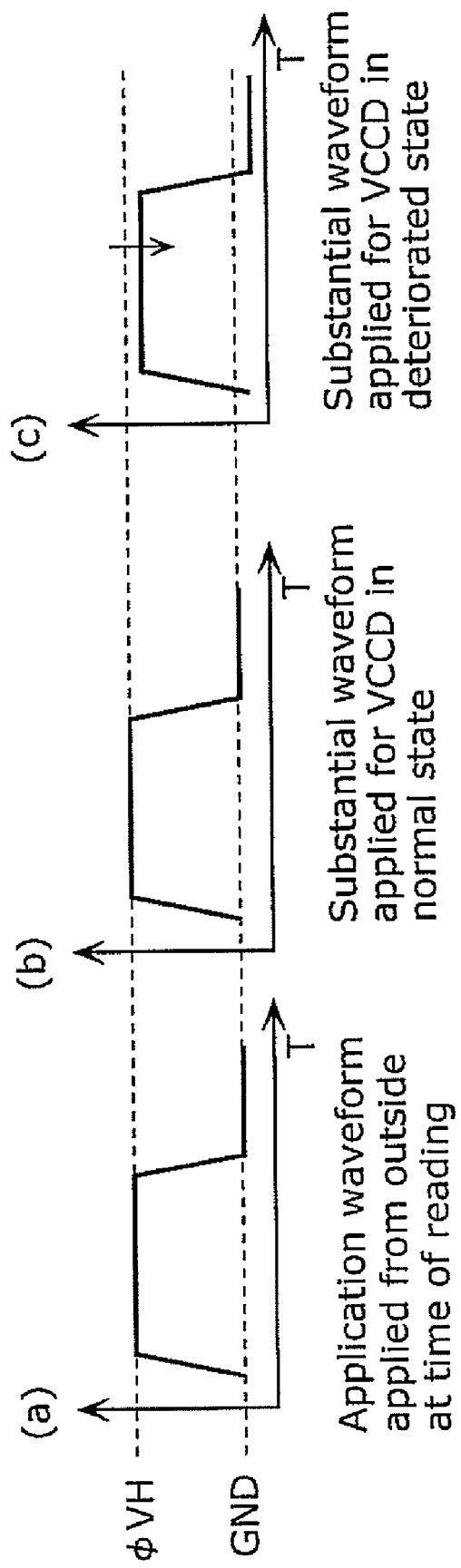
FIG. 14 is a diagram showing a waveform of a reading voltage.

FIG. 13 is a cross section view of a solid-state image sensor for describing a mechanism in which transfer efficiency of a vertical CCD is deteriorated. FIG. 14 is a diagram showing a waveform of a reading voltage.

Although a signal charge accumulated by a photodiode 460 is read by applying a reading voltage to a transfer electrode 471 of a vertical CCD 470 below a light-shielding film 473 (FIG. 13(a)), when the reading is repeated by using the transfer electrode 471 for a long time, the signal charge penetrates a VCCD (FIG. 13(b)), the portion of the signal charge is trapped in a gate insulator film 472, and the vertical CCD deteriorates (FIG. 13(c)). Thus, a reading voltage having a waveform (FIG. 14(b)) substantially identical to a waveform (FIG. 14(a)) of the reading voltage applied to the transfer electrode 471 is applied to the VCCD in the vertical CCD in a normal state (undeteriorated state). However, the gate insulator film 472 has a negative electric charge in the vertical CCD in a deteriorated state. Therefore, a reading voltage having a waveform (FIG. 14 (c)) which is obtained by shifting, to a negative side, the waveform (FIG. 14(a)) of the reading voltage which is applied to the transfer electrode 471 is applied to the VCCD in the vertical CCD in the deteriorated state. As a result, the reading voltage increases, which results in the reading residue.

Such reading residue caused due to the increase of the reading voltage results in an image defect such as surface roughness of an image in the solid-state image sensor in which the wiring that provides the driving pulse to the transfer electrode has the shunt wiring structure. The reason is that, unlike the solid-state image sensor in which the wiring that provides the driving pulse to the transfer electrode does not have the shunt wiring structure, a degree of the increase in the reading voltage differs depending on a transfer electrode. Thus, an impact given by the reading residue caused due to the increase of the reading voltage differs depending on a photodiode and such reading residue caused due to the increase of the reading voltage appears as the image defect such as the surface roughness of the image.

Figure 15:
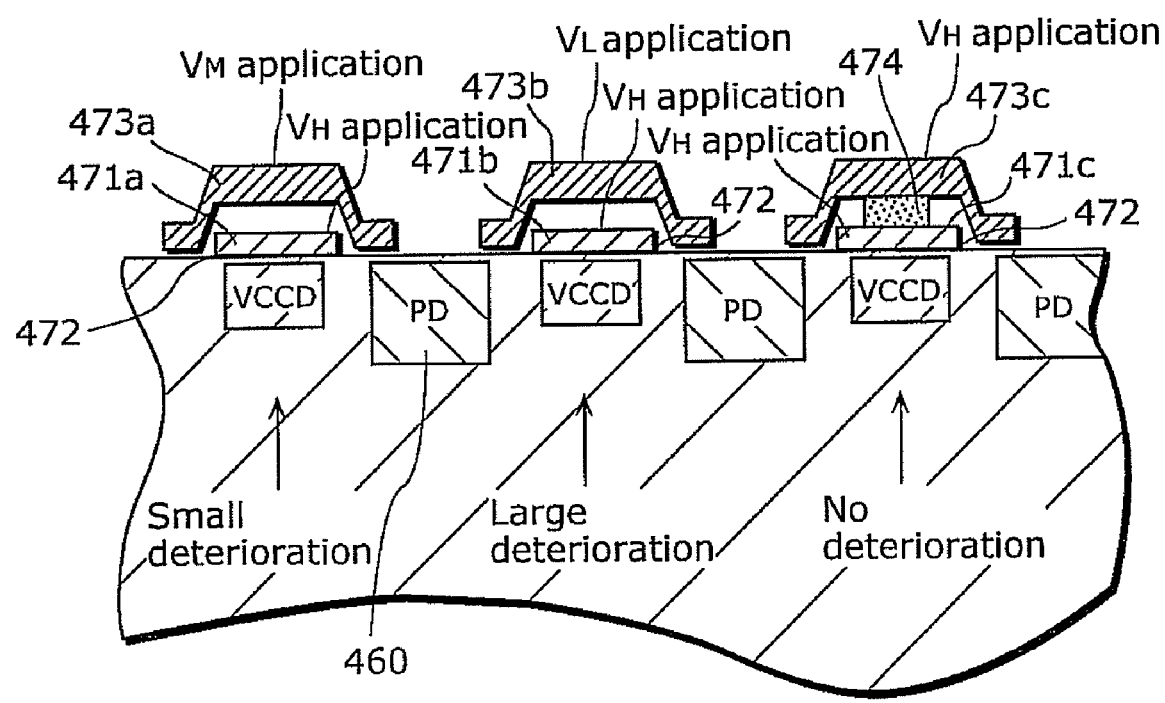
FIG. 15 is a cross section view of a solid-state image sensor in which wiring that provides a driving pulse to a transfer electrode has a shunt wiring structure.

More specifically, as shown in the cross section view of the solid-state image sensor by FIG. 15, in a vertical CCD below a conductive light-shielding film 473c which provides a reading voltage (electric potential $V_H$), when the reading voltage (electric potential $V_H$) is applied to a transfer electrode 471c via a contact 474, a difference in electric potential is not generated between the transfer electrode 471c and the conductive light-shielding film 473c. Thus, trapping a signal charge in a gate insulator film 472 hardly occurs, and the increase in the reading voltage is less likely to occur.

However, in a vertical CCD below a conductive light-shielding film 473a or 473b which provides a voltage (electric potential $V_M$ or $V_L$) lower than the reading voltage, when the reading voltage (electric potential $V_H$) is applied to the transfer electrode 471a or 471b, a difference in electric potential is generated between the transfer electrode 471a and the conductive light-shielding film 473a or the transfer electrode 471b and the conductive light-shielding film 473b.

The difference in electric potential is especially large between the transfer electrode 471a and the conductive light-shielding film 473a. Thus, the increase in the reading voltage is highly likely to occur in the vertical CCD below the conductive light-shielding film 473a or 473b. Consequently, the degree of increase in the reading voltage differs in each of the vertical CCD, which results in unevenness of amount of reading residue within a screen and the notable image defect such as the surface roughness of the image.

On the other hand, in the solid-state image sensor in which the wiring that provides the driving pulse to the transfer electrode does not have the shunt wiring structure, since the light-shielding film is either connected to GND or in unsteady state, the increase in the reading voltage itself does not occur easily, and even if the increase occurred, the amount of reading residue would be almost even and would not lead to the image defect.

As stated above, the solid-state imaging device according to the present embodiment makes it possible to reduce the increase in the reading voltage. Therefore, the solid-state imaging device according to the present embodiment is especially useful to a camera that includes a solid-state image sensor in which the reading residue is likely to be uneven and in which a wiring that provides the driving pulse to the transfer electrode has a shunt wiring structure.

Although the method of driving the solid-state imaging device according to the present invention has been described based on the embodiments, the present invention is not limited to the embodiments. The present invention includes modifications conceived by a person with an ordinary skill in the art within the scope of the present invention.

For example, the vertical CCD is the six-phase driving CCD including the transfer electrodes V1 to V6 in the above embodiments. However, as long as the vertical CCD is a CCD to which the method of transferring the signal charge according to the above embodiments can be applied, that is, a CCD including transfer electrodes to which a five- or more phase driving pulse is applied, the vertical CCD is not limited to the above CCD, and may be, for instance, an eight-phase driving CCD.

(Modification of Embodiments 1 and 2)

Although the above embodiments have described the solid-state image sensor in which the transfer electrodes (vertical transfer electrodes) of the vertical CCD have a six-phase structure, a solid-state image sensor in which vertical transfer electrodes have a twelve-phase structure can produce the same effect as the solid-state image sensor in which the transfer electrodes have the six-phase structure.

The following describes a solid-state imaging device in which the vertical transfer electrodes have the twelve-phase structure with reference to the drawings, the solid-state imaging device being the solid-state imaging device according to the embodiments of the present invention.

Figure 16:
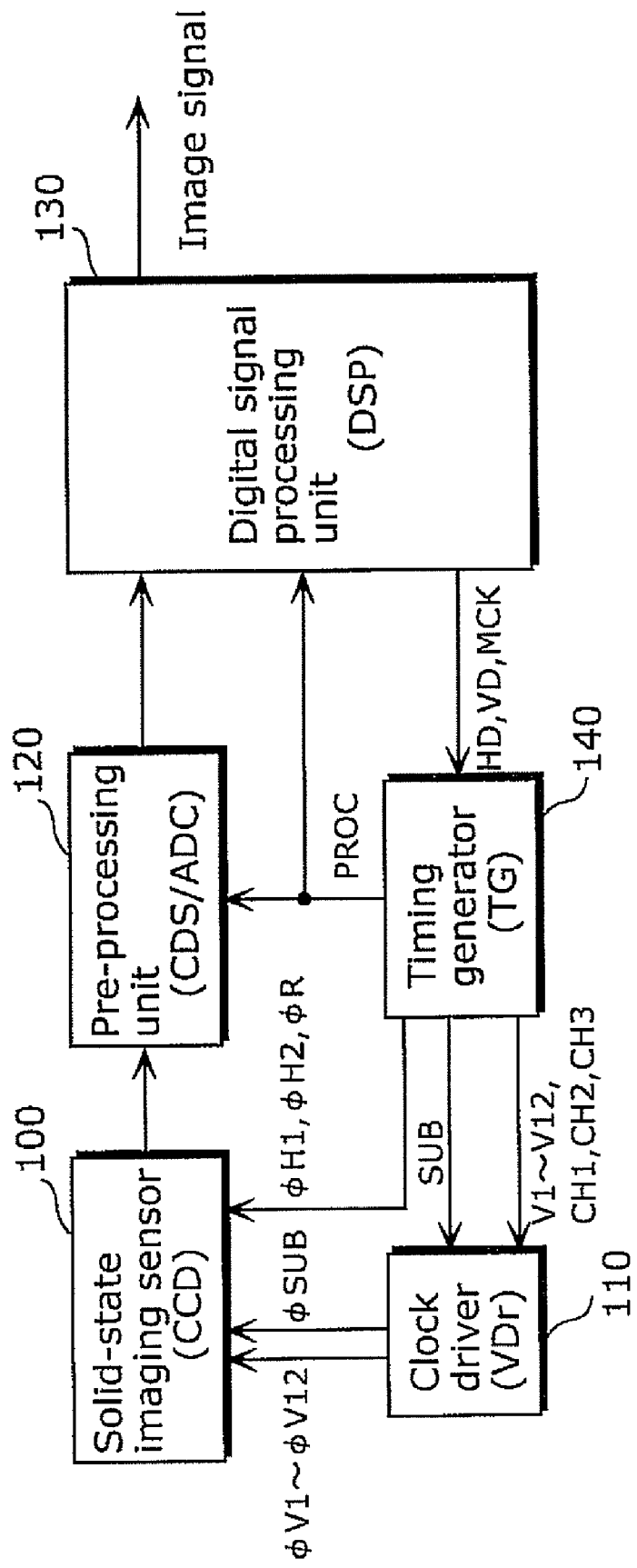
FIG. 16 is a diagram showing a schematic structure of the solid-state imaging device according to a modification of Embodiments 1 and 2.
Figure 17:
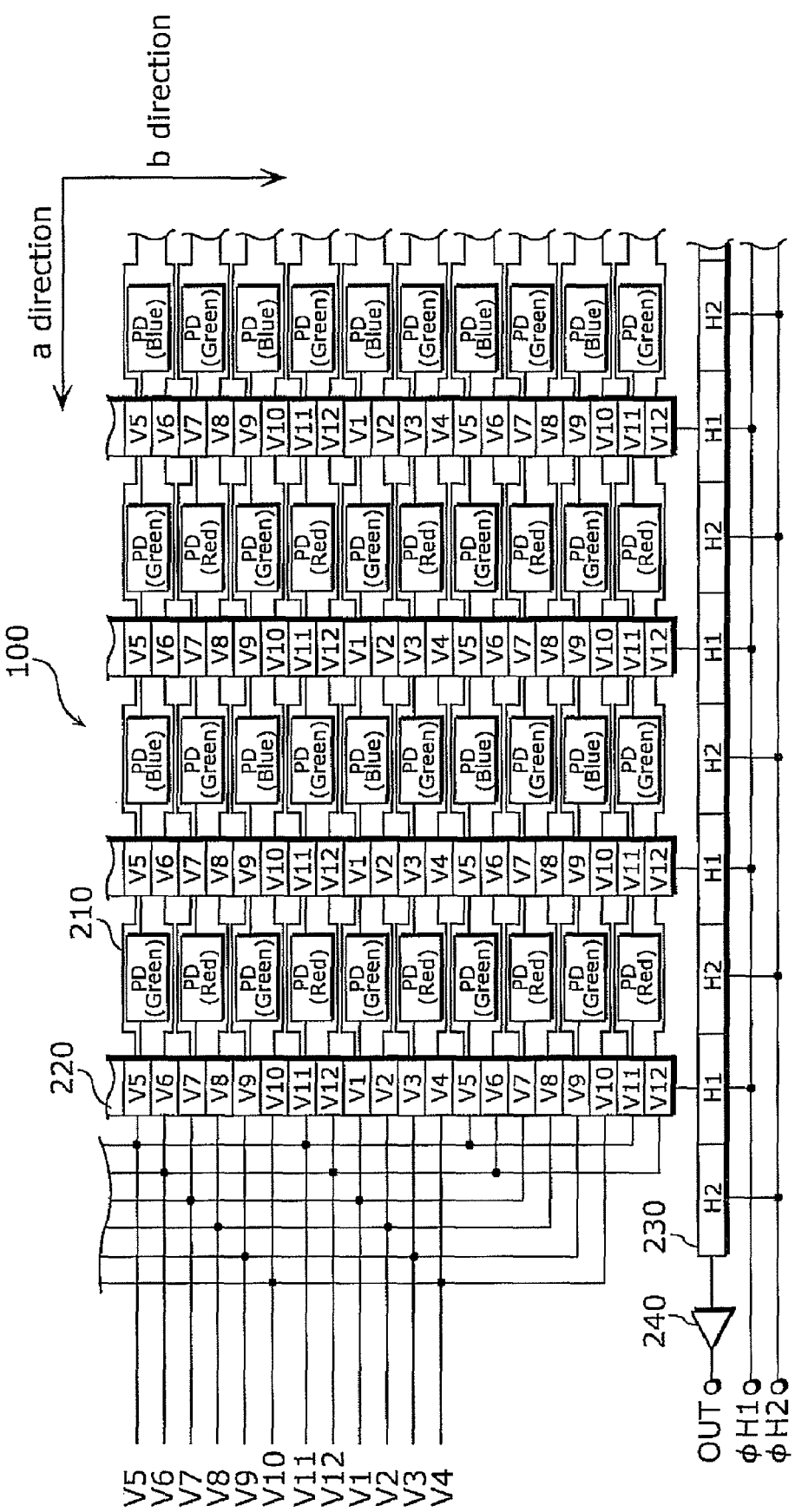
FIG. 17 is a diagram showing a detailed structure of the solid-state image sensor according to the modification.

FIG. 16 is a diagram showing a schematic structure of a solid-state imaging device according to the present modification, and FIG. 17 is a diagram showing a detailed structure of a solid-state image sensor 100 according to the present modification.

Furthermore, FIGS. 18A to 18C each are a diagram showing a method of transferring a signal charge in a twelve-phase vertical CCD. FIG. 18A is a timing diagram showing the method of transferring, FIG. 18B is a charge transfer conceptual diagram showing the method of transferring, and FIG. 18C is a potential distribution variation diagram showing the method of transferring.

First, FIG. 18A shows that, at a time t1, driving pulses φV8 to φV10 are at a low level, and an electric potential $V_L$ is applied to transfer electrodes V8 to V10. As a result, a potential well for accumulating signal charges is formed below transfer electrodes V1 to V7 and V11 and V12.

At a time t2, a driving pulse φV1 is at a high level, and an electric potential $V_H$ is applied to a transfer electrode V1 that is a predetermined reading electrode among a plurality of reading electrodes. Consequently, a signal charge of the photodiode 210 provided for the transfer electrode V1 is read into below the transfer electrode V1. While the electric potential $V_H$ is being applied to the transfer electrode V1, the driving pulse φV2 is at a middle level and an electric potential $V_M$ is applied to the transfer electrode V2 that is one of the transfer electrodes adjacent to the transfer electrode V1.

At a time t3, the driving pulse φV11 is changed into an electric potential having a reverse polarity with respect to the driving pulse φV1 so as to be at a low level, and an electric potential of the transfer electrode V11 is changed into the electric potential $V_L$ having a reverse polarity with respect to the electric potential $V_H$. This can suppress an influence on variation in electric potential below the transfer electrode V1 that contributes to reading a signal charge, and a potential shape below the transfer electrode V1 is further changed into a large slope gradually sloping downward from the photo-diode 210 to the vertical CCD 220. Consequently, a reading residue when reading the signal charge of the photodiode 210 to the vertical CCD 220 can be prevented from occurring. In the present invention, the electric potentials of the transfer electrodes which have larger areas and to which reading voltage is applied when subsequent reading of the signal charge (in the present modification, V1, V3, V5, V7, V9 and V11 have larger areas) are changed. The transfer electrodes are other than predetermined transfer electrodes to which reading voltage is being applied among transfer electrodes (reading electrodes) to which reading voltage is applied. Accordingly, the reading residue can be further prevented from occurring, compared to the technique disclosed in Patent Reference 1.

At a time t4, the driving pulse φV12 is changed into an electric potential having a reverse polarity with respect to the driving pulse φV1 so as to be at a low level, and the electric potential of the transfer electrode V12 is changed into the electric potential $V_L$ having a reverse polarity with respect to the electric potential $V_H$. This further changes the potential shape below the transfer electrode V1 that contributes to reading the signal charge. As a result, the reading residue when reading the signal charge of the photodiode 210 to the vertical CCD 220 is highly likely to be prevented from occurring.

At a time t5, the driving pulse φV1 is at a middle level, and the electric potential $V_M$ is applied to the transfer electrode V1. As a result, the read signal charge is transferred to the potential well below the transfer electrodes V1 to V7.

At a time t6, the driving pulse φV8 is at a middle level, and the electric potential $V_M$ is applied to the transfer electrode V8. As a result, the read signal charge is transferred to the potential well below the transfer electrodes V1 to V8.

At a time t7, the driving pulse φV9 is at a middle level, and the electric potential $V_M$ is applied to the transfer electrode V9. As a result, the read signal charge is transferred to the potential well below the transfer electrodes V1 to V9.

At a time t8, the driving pulse φV10 is at a middle level, and the electric potential $V_M$ is applied to the transfer electrode V10. As a result, the read signal charge is transferred to the potential well below the transfer electrodes V1 to V10.

Moreover, in the present modification, it has been described that while the driving pulse φV1 is at a high level, the driving pulses φV11 and φV12 each are changed into the electric potential having the reverse polarity with respect to the driving pulse V1 so as to be at a low level, and the electric potentials of the transfer electrodes V11 and V12 each are changed into the electric potential $V_L$ having the reverse polarity with respect to the electric potential $V_H$. However, the transfer electrode whose electric potential is changed may be one of transfer electrodes that are adjacent to the transfer electrode to which the electric potential $V_H$ is being applied or a transfer electrode to which the electric potential $V_H$ that is reading voltage is applied. The same advantageous effects can be produced even when, for instance, the electric potential of the transfer electrode V9 instead of the transfer electrode V11 is changed to the electric potential $V_L$.

Figure 19B:
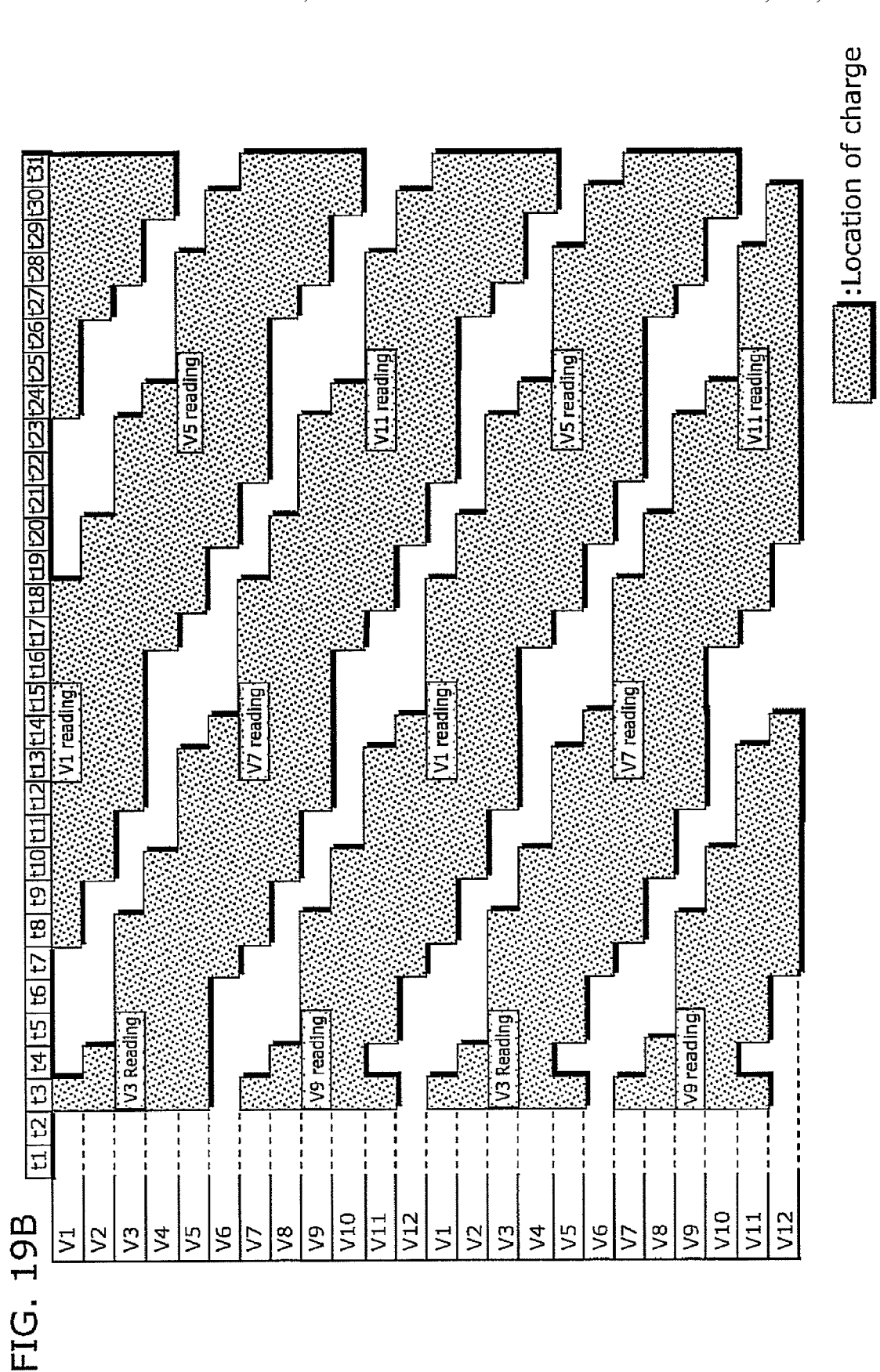
FIG. 19B is a charge mixture transfer conceptual diagram showing signal charge mixture in the vertical CCD according to the modification.
Figure 19D:
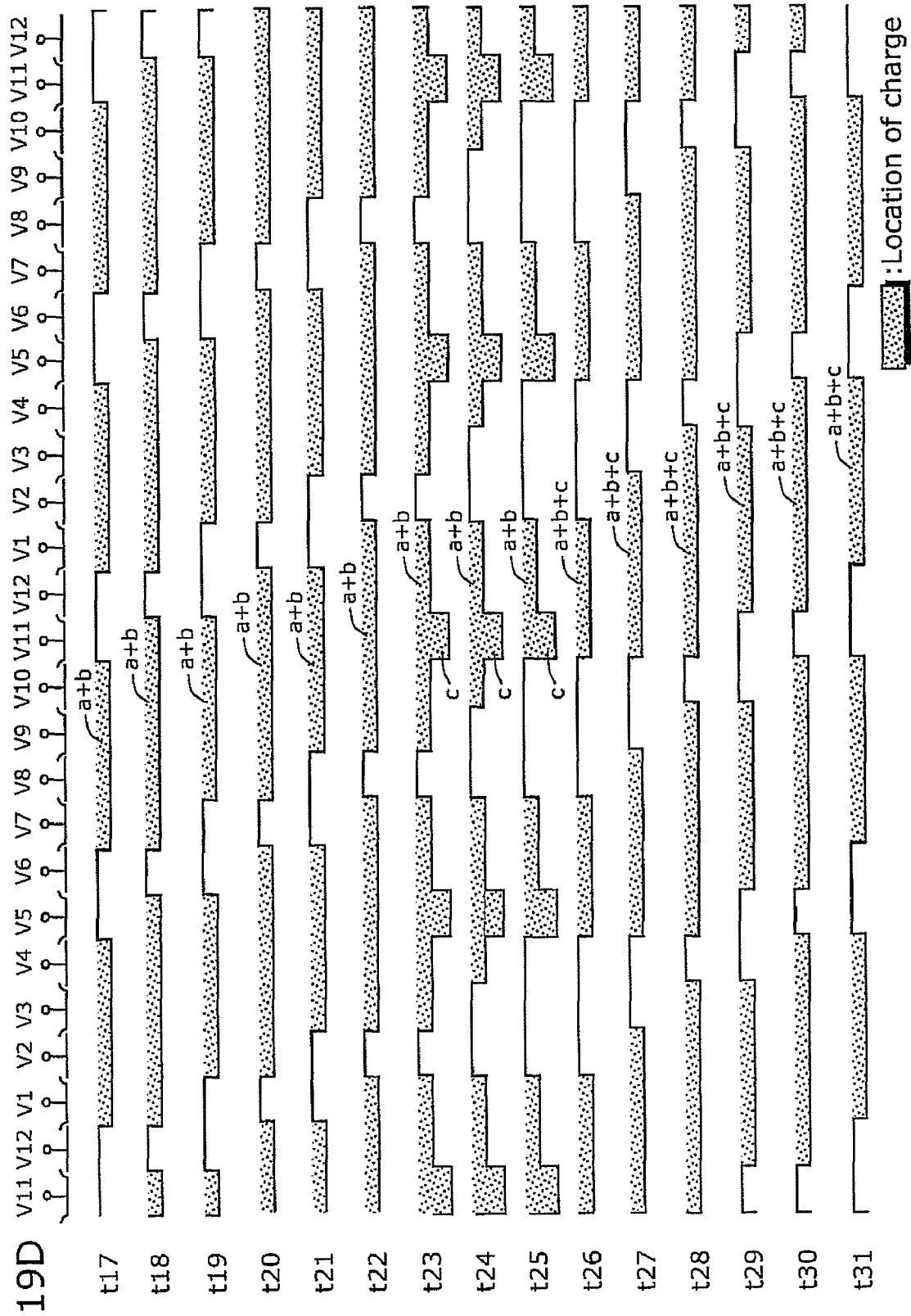
FIG. 19D is a potential distribution variation diagram showing signal charge mixture in the vertical CCD according to the modification.

FIGS. 19A to 19D each are a diagram showing signal charge mixture (pixel mixture) in a twelve-phase vertical CCD 220. FIG. 19A is a timing diagram showing the signal charge mixture, FIG. 19B is a charge mixture transfer conceptual diagram showing the signal charge mixture, and FIGS. 19C and 19D each are a potential distribution variation diagram showing the signal charge mixture. Six types of driving pulses, φV1=φV7, φV2=φV8, φV3=φV9, φV4=φV10, φV5=φV11, and φV6=φV12, are applied with driving timing according to the present modification, and the same electric potential is applied to the transfer electrodes V1 and V7. Likewise, the same electric potential is applied to the transfer electrodes V2 and V8, the transfer electrodes V3 and V9, the transfer electrodes V4 and V10, the transfer electrodes V5 and V11, and the transfer electrodes V6 and V12, and this operation is the same as the operation shown in FIGS. 5A to 5D in terms of charge transfer.

It is to be noted that, in the present modification, twelve-phase driving is performed by applying the twelve types of driving pulses to the vertical CCD when the pixel mixture is not performed (for example, in the case of a driving mode where a still image is captured), and six-phase driving is performed by applying the six types of driving pulses to the vertical CCD when the pixel mixture is performed (in the case of other modes in which the pixel mixture is performed). However, as shown in FIGS. 20A to 20C, the six-phase driving may be performed using the six types of driving pulses when the pixel mixture is not performed. Further, the twelve-phase driving may also be performed using the twelve types of driving pulses when the pixel mixture is performed. It is to be noted that there are advantages of increasing the transfer capacity of the transfer electrode and further improving the saturation characteristics when the twelve-phase driving is performed.

Industrial Applicability

The present invention can be applied to the methods for driving the solid-state imaging device, and in particular to the method of driving the CCD solid-state imaging device.

The invention claimed is:

1. A method of driving a solid-state imaging device which includes photodiodes and vertical transfer units, the photodiodes being arranged in columns and rows, and each of the vertical transfer units being provided for a corresponding one of the columns of the photodiodes and including transfer electrodes, said method comprising:

reading a signal charge from each of the photodiodes by setting, to a first electric potential, an electric potential of a predetermined reading electrode among reading electrodes that are included in the transfer electrodes, each of the reading electrodes being provided for reading the signal charge from a corresponding one of the photodiodes and for transferring the read signal charge in a column direction; and transferring, in the column direction, the read signal charge by applying, to each of the transfer electrodes, a driving pulse having a second electric potential and a third electric potential, the second electric potential being lower than the first electric potential, and the third electric potential being lower than the second electric potential, wherein in said reading, while the first electric potential is being applied to the predetermined reading electrode, (i) an electric potential of one of the transfer electrodes that is adjacent to the predetermined reading electrode is set to the second electric potential, and (ii) an electric potential of the other one of the transfer electrodes that is adjacent to the predetermined transfer electrode and an electric potential of a reading electrode that is included in the reading electrodes and that is other than the predetermined reading electrode are changed.

2. The method of driving the solid-state imaging device according to claim 1, wherein, in said transferring, a five- or more phase driving pulse is applied to each of the transfer electrodes.

3. The method of driving the solid-state imaging device according to claim 2, wherein each of the transfer electrodes includes a twelve-phase vertical CCD, and in said transferring, each of the transfer electrodes is driven by applying a twelve-phase driving pulse in a driving mode in which a still image is captured, and each of the transfer electrodes is driven by applying a six-phase driving pulse in a mode in which pixel mixture is performed.

4. The method of driving the solid-state imaging device according to claim 3, wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are changed to an electric potential having a reverse polarity with respect to the first electric potential.

5. The method of driving the solid-state imaging device according to claim 3, wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode is changed after the electric potential of a reading electrode that is included in the reading electrodes and that is other than the predetermined reading electrode is changed.

6. The method of driving the solid-state imaging device according to claim 3, wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are concurrently changed to an electric potential having a reverse polarity with respect to the first electric potential.

7. The method of driving the solid-state imaging device according to claim 2, wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are changed to an electric potential having a reverse polarity with respect to the first electric potential.

8. The method of driving the solid-state imaging device according to claim 2, wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode is changed after the electric potential of a reading electrode that is included in the reading electrodes and that is other than the predetermined reading electrode is changed.

9. The method of driving the solid-state imaging device according to claim 2,
wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are concurrently changed to an electric potential having a reverse polarity with respect to the first electric potential.

10. The method of driving the solid-state imaging device according to claim 1,
wherein each of the transfer electrodes includes a twelve-phase vertical CCD, and
in said transferring, each of the transfer electrodes is driven by applying a twelve-phase driving pulse in a driving mode in which a still image is captured, and each of the transfer electrodes is driven by applying a six-phase driving pulse in a mode in which pixel mixture is performed.

11. The method of driving the solid-state imaging device according to claim 1,
wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are changed to an electric potential having a reverse polarity with respect to the first electric potential.

12. The method of driving the solid-state imaging device according to claim 1,
wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode is changed after the electric potential of a reading electrode that is included in the reading electrodes and that is other than the predetermined reading electrode is changed.

13. The method of driving the solid-state imaging device according to claim 1,
wherein, in said reading, while the signal charge is being read, (i) the electric potential of the one of the transfer electrodes that is adjacent to the predetermined reading electrode is set to the second electric potential, and (ii) the electric potential of the other one of the transfer electrodes that is adjacent to the predetermined reading electrode and the electric potential of a reading electrode that is included in the reading electrodes and that is other than the predetermined reading electrode are concurrently changed to an electric potential having a reverse polarity with respect to the first electric potential.

14. A solid-state imaging device comprising:
photodiodes arranged in columns and rows;
vertical transfer units each of which is provided for a corresponding one of the columns of said photodiodes and includes transfer electrodes; and
a transfer control unit configured to (i) read a signal charge from each of the photodiodes by setting, to a first electric potential, an electric potential of a predetermined reading electrode among reading electrodes that are included in the transfer electrodes, each of the reading electrodes being provided for reading the signal charge from a corresponding one of the photodiodes and for transferring the read signal charge in a column direction, (ii) transfer, in the column direction, the read signal charge by applying, to each of the transfer electrodes, a driving pulse having a second electric potential and a third electric potential, the second electric potential being lower than the first electric potential, and the third electric potential being lower than the second electric potential, and (iii) in the reading of the signal charge, while the first electric potential is being applied to the predetermined reading electrode, set an electric potential of one of the transfer electrodes that are adjacent to the predetermined reading electrode, to the second electric potential, and change an electric potential of the other transfer electrode that is adjacent to the predetermined transfer electrode and an electric potential of a reading electrode that is included in the reading electrodes and that is other than the predetermined reading electrode either from the second electric potential to the third electric potential or from the third electric potential to the second electric potential,
wherein each of said reading electrodes has a larger area than two of the transfer electrodes that are adjacent to the each of said reading electrodes.

15. The method of driving the solid-state imaging device according to claim 1,
wherein each of the reading electrodes has a larger area than two of the transfer electrodes that are adjacent to the each of the reading electrodes.

16. The solid-state imaging device according to claim 14,
wherein each of the reading electrodes has a larger area than two of the transfer electrodes that are adjacent to the each of the reading electrodes.

* * * * *